United States Patent
Shibata et al.

(10) Patent No.: US 10,326,010 B2
(45) Date of Patent: Jun. 18, 2019

(54) SEMICONDUCTOR DEVICE AND METHOD OF MANUFACTURING THE SEMICONDUCTOR DEVICE

(71) Applicant: SHINDENGEN ELECTRIC MANUFACTURING CO., LTD., Tokyo (JP)

(72) Inventors: Yukihiro Shibata, Hanno (JP); Tadashi Inoue, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 95 days.

(21) Appl. No.: 15/311,524

(22) PCT Filed: Sep. 18, 2015

(86) PCT No.: PCT/JP2015/076683
§ 371 (c)(1),
(2) Date: Nov. 16, 2016

(87) PCT Pub. No.: WO2017/046944
PCT Pub. Date: Mar. 23, 2017

(65) Prior Publication Data
US 2018/0182876 A1 Jun. 28, 2018

(51) Int. Cl.
*H01L 29/06* (2006.01)
*H01L 29/74* (2006.01)
(Continued)

(52) U.S. Cl.
CPC ...... *H01L 29/7428* (2013.01); *H01L 29/0834* (2013.01); *H01L 29/0839* (2013.01);
(Continued)

(58) Field of Classification Search
CPC ........... H01L 29/7428; H01L 29/66386; H01L 29/747
See application file for complete search history.

(56) References Cited

U.S. PATENT DOCUMENTS

| 4,939,564 A | 7/1990 | Asakura et al. |
| 2011/0220960 A1* | 9/2011 | Moroda ............ H01L 29/66386 257/120 |

FOREIGN PATENT DOCUMENTS

| FR | 2982077 | 5/2013 |
| JP | 61230369 A | 10/1986 |

(Continued)

OTHER PUBLICATIONS

International Search Report (ISR) relating to International Application No. PCT/JP2015/076683, dated Dec. 15, 2015.
(Continued)

*Primary Examiner* — Joseph M Galvin, III
(74) *Attorney, Agent, or Firm* — The Harris Firm

(57) ABSTRACT

A semiconductor device includes a semiconductor substrate having a first surface and a second surface, first to eighth regions, a first thyristor, and a second thyristor. The seventh region with the impurity concentration higher than that of the first region is formed in the first region while being apart from the sixth region electrically connected to the gate electrode, and being electrically connected to the first electrode. The eighth region with the impurity concentration higher than that of the third region is formed in contact with the second surface side of the third region and the fourth region, and with the second surface, while being electrically connected to the fourth region by the second electrode. The seventh region has the impurity concentration higher than that of the first region. The eighth region has the impurity concentration higher than that of the third region.

5 Claims, 15 Drawing Sheets

(51) Int. Cl.
- *H01L 29/747* (2006.01)
- *H01L 29/66* (2006.01)
- *H01L 29/08* (2006.01)

(52) U.S. Cl.
CPC ...... *H01L 29/66386* (2013.01); *H01L 29/747* (2013.01); *H01L 29/0615* (2013.01)

(56) References Cited

FOREIGN PATENT DOCUMENTS

| | | | |
|---|---|---|---|
| JP | 01286465 A | 11/1989 | |
| JP | 02-114669 | 4/1990 | |
| JP | 2003203983 A | 7/2003 | |
| JP | 5618578 B | 9/2014 | |

OTHER PUBLICATIONS

English language translation of International Search Report (ISR) relating to International Application No. PCT/JP2015/076683, dated Dec. 15, 2015.

Written Opinion of the ISA relating to International Application No. PCT/JP2015/076683, dated Dec. 15, 2015.

European Patent Office, Extended European Search Report relating to EP 15890169.4, dated Mar. 19, 2019.

* cited by examiner

SEMICONDUCTOR DEVICE AND METHOD OF MANUFACTURING THE SEMICONDUCTOR DEVICE

CROSS REFERENCE TO PRIOR APPLICATION(S)

This application is a U.S. National Stage Patent Application of PCT International Patent Application Ser. No. PCT/JP2015/076683 (filed on Sep. 18, 2015) under 35 U.S.C. § 371, which is hereby incorporated by reference herein in its entirety.

TECHNICAL FIELD

The present invention relates to a semiconductor device and a method of manufacturing the semiconductor device.

BACKGROUND ART

Semiconductor devices in which two thyristors are connected in anti-parallel so that current can flow in both directions (hereinafter referred to as TRIACs) are known (see for example, Patent Document 1).

For example, regarding the TRIAC described in Patent Document 1, P+ regions are formed on a first surface of a semiconductor substrate on which a first electrode and a gate electrode are formed, and on a second surface of the semiconductor substrate on which a second electrode is formed. Additionally, a P++ region, which is a high concentration region, is formed so as to be included in the P+ region. In the TRIAC described in Patent Document 1, the high concentration region (P++ region) is formed, thereby making it possible to encourage a recombination of carriers and achieve an improvement of (dv/dt)c (a rate of an increase in critical off-state voltage during commutation), that is, a suppression of commutation failures. Further, in the TRIAC described in Patent Document 1, the high concentration region is formed, thereby improving the ohmic property with the electrodes and reducing the on-voltage.

CITATION LIST

Patent Document

[Patent Document 1] Japanese Patent No. 5618578

DISCLOSURE OF THE INVENTION

Problems to be Solved by the Invention

In the above-described TRIAC described in Patent Document 1, however, hFE (DC current amplification factor of collector current) of internal transistors of the TRIAC is reduced due to the effect of the high concentration region (P++ region). For this reason, in the above-described TRIAC described in Patent Document 1, the gate trigger current required for the on-operation increases, and thus an unbalanced state occurs where gate trigger currents of a mode-I and a mode-III among the mode-I, a mode-II, and the mode-III which are TRIAC-specific trigger modes become higher than the gate trigger current of the mode-I (see waveform W1 in FIG. 15). In other words, it has been difficult in the above-mentioned TRIAC described in Patent Document 1 to reduce the unbalance of the gate trigger currents among the trigger modes while reducing the on-voltage.

The present invention has been made to solve the above problem, and an object thereof is to provide a semiconductor device and a method of manufacturing the semiconductor device, which are capable of reducing the unbalance of the gate trigger currents among the trigger modes while reducing the on-voltage.

Means for Solving the Problems

In order to solve the above problems, one aspect of the present invention is a semiconductor device including: a first thyristor wherein a first region of a first conductivity type, a second region of a second conductivity type, a third region of the first conductivity type, a fourth region of the second conductivity type are joined sequentially from a first surface side to a second surface of a semiconductor substrate having the first surface and the second surface opposite to the first surface, and a current flows from a first electrode formed on the first surface while being electrically connected to the first region to a second electrode formed on the second surface while being electrically connected to the fourth region; a thyristor TY2 wherein the third region, the second region, the first region, and a fifth region of the second conductivity type formed in contact with the first surface while being included in the first region are joined sequentially from the second surface side to the front surface, and a current flows from the second electrode to the first electrode electrically connected to the fifth region; a sixth region of the second conductivity type formed in contact with the first surface while being included in the first region and apart from the fifth region; a gate electrode formed on the front surface while electrically connecting the first region and the sixth region; a seventh region of the first conductivity type with an impurity concentration higher than that of the first region, which is formed in contact with the first surface while being included in the first region and apart from the sixth region and being electrically connected to the fifth region by the first electrode; and an eighth region of the first conductivity type with an impurity concentration higher than that of the third region, which is formed in contact with the second surface side of the third region and the fourth region, and with the second surface, while being electrically connected to the fourth region by the second electrode.

Additionally, in the above-described semiconductor device according to one aspect of the present invention, the fourth region and the fifth region are formed apart by a predetermined distance in a direction parallel to the first surface and the second surface, so as not to overlap each other on a line perpendicular to the first surface and the second surface, and the predetermined distance is determined so that while a current is flowing in the first thyristor in one direction or the second thyristor in an opposite direction, residual carriers present in a current path of the thyristor through which the current is not flowing disappear.

Further, in the above-described semiconductor device according to one aspect of the present invention, the seventh region is formed so as not to include a portion of the first surface, which is in contact with the gate electrode.

Moreover, in the above-described semiconductor device according to one aspect of the present invention, the seventh region is a region formed by diffusing a semiconductor impurity of the first conductivity type from the first surface, the eighth region is a region formed by diffusing a semiconductor impurity of the first conductivity type from the second surface, and the seventh region and the eighth region are regions formed by simultaneously diffusing a semiconductor impurity of the first conductivity type.

Additionally, another aspect of the present invention is a method of manufacturing a semiconductor device, the semiconductor device including: a first thyristor wherein a first region of a first conductivity type, a second region of a second conductivity type, a third region of the first conductivity type, a fourth region of the second conductivity type are joined sequentially from a first surface side to a second surface of a semiconductor substrate having the first surface and the second surface opposite to the first surface, and a current flows from a first electrode formed on the first surface while being electrically connected to the first region to a second electrode formed on the second surface while being electrically connected to the fourth region; a thyristor TY2 wherein the third region, the second region, the first region, and a fifth region of the second conductivity type formed in contact with the first surface while being included in the first region are joined sequentially from the second surface side to the front surface, and a current flows from the second electrode to the first electrode electrically connected to the fifth region; and a sixth region of the second conductivity type formed in contact with the first surface while being included in the first region and apart from the fifth region; a gate electrode formed on the front surface while electrically connecting the first region and the sixth region. The method includes: a first step of forming a seventh region of the first conductivity type with a impurity concentration higher than that of the first region 1 so as to be in contact with the first surface while being included in the first region and apart from the sixth region and being electrically connected to the fifth region by the first electrode; and a second step of forming an eighth region of the first conductivity type with a impurity concentration higher than that of the third region so as to be in contact with the second surface side of the third region and the fourth region, and with the second surface, while being electrically connected to the fourth region by the second electrode.

Effects of the Invention

According to the present invention, in the semiconductor device, the seventh region with the impurity concentration higher than that of the first region is formed in the first region while being apart from the sixth region electrically connected to the gate electrode, and being electrically connected to the first electrode. Additionally, in the semiconductor device, the eighth region with the impurity concentration higher than that of the third region is formed in contact with the second surface side of the third region and the fourth region, and with the second surface, while being electrically connected to the fourth region by the second electrode. The seventh region has the impurity concentration higher than that of the first region, thus enabling an improvement of the ohmic property of the first electrode. The eighth region has the impurity concentration higher than that of the third region, thus enabling an improvement of the ohmic property of the second electrode. For this reason, the semiconductor device can reduce the on-voltages. Further, the seventh region is formed apart from the sixth region connected to the gate electrode, thereby reducing the imbalance in gate trigger current among the trigger modes (the gate trigger currents of the mode-II and the mode-III can be reduced to about that of the mode-I) without causing no reduction in hFE of the internal transistor. Therefore, the semiconductor device can reduce the imbalance in gate trigger current among the trigger modes while reducing the on-voltages.

MODE FOR CARRYING OUT THE INVENTION

Hereinafter, a semiconductor device and a method of manufacturing the semiconductor device according to an embodiment of the present invention will be described with reference to the drawings.

First, a configuration of a semiconductor device according to the present embodiment will be described with reference to FIG. 1.

Figure 1:
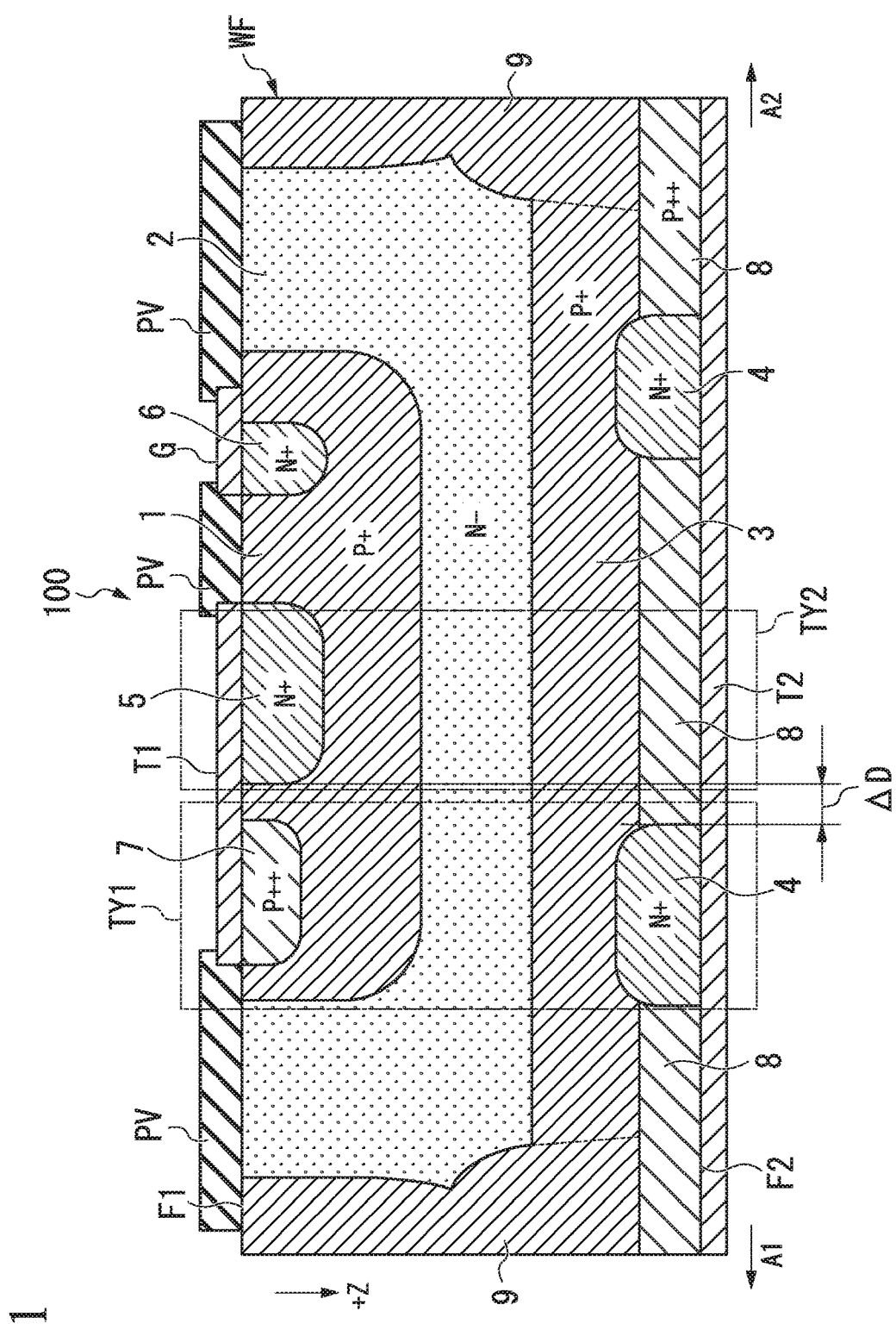
FIG. 1 is a sectional configuration diagram showing an example of a semiconductor device according to the present embodiment.

FIG. 1 is a sectional configuration diagram showing an example of a semiconductor device 100 according to the present embodiment. Here, the sectional view shown in FIG. 1 is a sectional view on a broken line between A1-A2 shown in FIG. 2.

As shown in FIG. 1, the semiconductor device 100 includes P+ regions (1, 3), an N− region 2, N+ regions (4, 5, 6), and P++ regions (7, 8), an ISO (isolation) portion 9, a first electrode T1, a second electrode T2, a gate electrode G, and an insulating film PV.

Additionally, the semiconductor device 100 is a TRIAC with two thyristors (TY1, TY2) in a semiconductor substrate WF.

The semiconductor substrate WF has a front (front) surface F1 that is a main surface (an example of a first surface), and a rear surface F2 that is a main surface opposite to the front surface F1 (an example of a second surface). Here, in FIG. 1, a direction perpendicular to the front surface F1 and the rear surface F2 is defined as a Z axis direction. A direction from the front surface F1 toward the rear surface F2 is defined as a +Z axis direction. A direction from the rear surface F2 toward the front surface F1 is defined as a −Z axis direction.

In the thyristor TY1 (an example of a first thyristor), the P+ region 1, the N− region 2, the P+ region 3, and the N+ region 4 are joined sequentially from the front surface F1 side toward the rear surface F2. In the thyristor TY1, current flows from the first electrode T1 to the second electrode T2 (in the +Z axis direction).

In the thyristor TY2 (an example of a second thyristor), the P+ region 3, the N− region 2, the P+ region 1, and the N+ region 5 are joined sequentially from the rear surface F2 side toward the front surface F1. In the thyristor TY2, current flows from the second electrode T2 to the first electrode T1 (in the −Z axis direction).

The P+ region 1 (an example of the first region) is a region of a P type semiconductor (an example of a first conductivity type), which is formed in contact with the front surface F1 while being included in the N− region 2 of the semiconductor substrate WF that is the N type semiconductor (an example of a second conductivity type). The P+ region 1 is a region formed by diffusing a P type semiconductor impurity (e.g., B (boron), Al (aluminum), etc.) from the front surface F1. The P+ region 1 has is the region with an impurity concentration of, for example, approximately $1 \times 10^{16}$ to $1 \times 10^{18}$ cm$^{-3}$ in the vicinity of the front surface F1 portion and a depth of 10 μm (micrometers) to 70 μm in the +Z axis direction from the front surface F1.

The N− region 2 (an example of the second region) is a region of an N type semiconductor and is formed in contact with the P+ region 1, the P+ region 3, and the ISO portion 9. The N− region 2 is a region with an impurity concentration of, for example, approximately $2 \times 10^{13}$ to $1 \times 10^{18}$ cm$^{-3}$.

The P+ region 3 (an example of the third region) is a region of a P type semiconductor, and is formed in contact with the N− region 2 and the ISO portion 9. The P+ region 3 is a region formed by diffusing a P type semiconductor impurity (e.g., B, Al, etc.) from the rear surface F2. Before the P++ region 8 is formed, the P+ region 3 is a region with an impurity concentration of, for example, approximately $1 \times 10^{16}$ to $1 \times 10^{18}$ cm$^{-3}$ in the vicinity of the rear surface portion F2, and a depth of 10 μm to 70 μm in the −Z axis direction from the rear surface F2.

The N+ region 4 (an example of a fourth region) is a region of an N type semiconductor, which is formed in contact with the rear surface F2 while being included in the P+ region 3 and the P++ region 8, but not fully included in the P++ region 8 alone. The N+ region 4 is a region formed by diffusing an N type semiconductor impurity (e.g., P (phosphorus), etc.) from the rear surface F2. The N+ region 4 is a region with an impurity concentration of, for example, approximately $1 \times 10^{18}$ to $1 \times 10^{20}$ cm$^{-3}$ in the vicinity of the rear surface F2 portion. Additionally, the N+ region 4 is a region with a depth of 5 μm to 60 μm in the −Z axis direction from the rear surface F2, which is less than the depth of the P+ region 3 in the −Z axis direction. Further, the N+ region 4 is electrically-connected by ohmic contact with the second electrode T2.

The N+ region 5 (an example of a fifth region) is a region of an N type semiconductor, which is formed in contact with the front surface F1 while being included in the P+ region 1. The N+ region 5 is a region formed by diffusing an N type semiconductor impurity (e.g., P, etc.) from the front surface F1. The N+ region 5 is a region with an impurity concentration of, for example, approximately $1 \times 10^{18}$ to $1 \times 10^{20}$ cm$^{-3}$ in the vicinity of the front surface F1 portion. Additionally, the N+ region 5 is a region with a depth of 5 μm to 60 μm in the +Z axis direction from the front surface F1, which is less than the depth of the P+ region 1 in the +Z axis direction. Further, the N+ region 5 is electrically-connected by ohmic contact with the first electrode T1.

Here, the N+ region 4 and the N+ region 5 are formed apart by a predetermined distance ΔD in a direction parallel to the front surface F1 and the rear surface F2, so as not to overlap with each other on a straight line perpendicular to the front surface F1 and the rear surface F2 (e.g., on a straight line in the Z axis direction). Here, the predetermined distance ΔD is determined so that while the current is flowing in the thyristor TY1 in one direction or the thyristor TY2 in the opposite direction, residual carriers present in the current path of the thyristor through which the current is not flowing disappear. The predetermined distance ΔD is, for example, is 50 μm to 1000 μm.

The N+ region 6 (an example of a sixth region) is a region of an N type semiconductor, which is formed in contact with the front surface F1 while being included in the P+ region 1 and apart from the N+ region 5. The N+ region 6 is a region formed by diffusing an N type semiconductor impurity (e.g., P, etc.) from the front surface F1. The N+ region 6 is a region with an impurity concentration of, for example, approximately $1 \times 10^{18}$ to $1 \times 10^{20}$ cm$^{-3}$ in the vicinity of the front surface F1 portion. Additionally, the N+ region 6 is a region with a depth of 5 μm to 60 μm in the +Z axis direction from the front surface F1, which is less than the depth of the P+ region 1 in the +Z axis direction. Further, the N+ region 6 is electrically-connected by ohmic contact with the gate electrode G.

The P++ region 7 (an example of a seventh region) is formed in contact with the front surface F1, while being included in the P+ region 1 and apart from the N+ region 6. The P++ region 7 is a P type semiconductor region with an impurity concentration higher than that of the P+ region 1 while being electrically connected to the N+ region 5 by the first electrode T1.

Additionally, the P++ region 7 is a region formed by diffusing a P type semiconductor impurity (e.g., B, Al, etc.) from the front surface F1. The P++ region 7 is a region with an impurity concentration of, for example, approximately $1 \times 10^{18}$ to $1 \times 10^{20}$ cm$^{-3}$ in the vicinity of the front surface F1 portion. Further, the P++ region 7 is a region with a depth of 5 μm to 60 μm in the +Z axis direction from the front surface F1, which is less than the depth of the P+ region 1 in the +Z axis direction.

Moreover, the P++ region 7 is electrically-connected by ohmic contact with the first electrode T1. Additionally, the P++ region 7 is partially formed so as not to include a portion of the front surface F1 which is in contact with the gate electrode G.

The P++ region 8 (an example of an eighth region) is a region formed in contact with the rear surface F2, while being in contact with the rear surface F2 side of the P+ region 3 and the N+ region. Additionally, the P++ region 8 is a P type semiconductor region with an impurity concentration higher than that of the P+ region 3, while being electrically connected to the N+ region 4 by the second electrode T2.

Further, the P++ region 8 is a region formed by diffusing a P type semiconductor impurity (e.g., B, Al, etc.) from the rear surface F2. The P++ region 8 is a region with an impurity concentration of, for example, approximately $1 \times 10^{18}$ to $1 \times 10^{20}$ cm$^{-3}$ in the vicinity of the rear surface F2 portion. Moreover, the P++ region 8 is a region with a depth of 5 μm to 60 μm in the −Z axis direction from the rear surface F2, which is less than the depth of the P+ region 3 and the N+ region 4 in the −Z axis direction. Additionally, the P++ region 8 is electrically-connected by ohmic contact with the second electrode T2.

The ISO portion 9 is a region of a P type semiconductor, which serves as an element isolation portion of the semiconductor device 100. In other words, the ISO portion 9 functions as an element isolation portion of the semiconductor device 100, which is formed at both ends of the TRIAC structure. The ISO portion 9 is formed so as to be exposed to the front surface F1 and the rear surface F2, while being in contact with the side surface, in the thickness direction, of the semiconductor device 100.

Additionally, the ISO portion 9 is a region formed by diffusing a P type semiconductor impurity (e.g., B, Al, etc.) from both the front surface F1 and the rear surface F2. The ISO portion 9 is a region with an impurity concentration of, for example, approximately $1 \times 10^{16}$ to $1 \times 10^{18}$ cm$^{-3}$ in the vicinity of the front surface F1 portion and the rear surface F2 portion. The ISO portion 9 is formed so as to penetrate through the semiconductor substrate WF in the thickness direction (Z axis direction). In other words, the ISO portion 9 is formed by diffusing the P type semiconductor impurity, so as to be deeper than ½ of the thickness of the semiconductor substrate WF in the Z axis direction.

The first electrode T1 is an electrode formed on the front surface F1 while being electrically connected to the P+ region 1. Additionally, the first electrode T1 is electrically connected to the N+ region 5 while being also electrically connected to the P++ region 7. In other words, the first electrode T1 is formed so as to short-circuit the P+ region 1, the P++ region 7, and the N+ region 5. Additionally, a material of the first electrode T1 is metal, for example, Al.

The second electrode T2 is an electrode formed on the rear surface F2 while being electrically connected to the N+ region 4. Additionally, the second electrode T2 is formed on the entire rear surface F2 of the semiconductor substrate WF, and is electrically connected to the N+ region 4 while being also electrically connected to the P++ region 8. In other words, the second electrode T2 is formed so as to short-circuit the P++ region 8 and the N+ region 4. Additionally, a material of the second electrode T2 is metal, for example, Al.

The gate electrode G is an electrode formed on the front surface F1 while electrically connecting the P+ region 1 and the N+ region 6. In other words, the gate electrode G is formed so as to short-circuit the P+ region 1 and the N+ region 6. Here, the P++ region 7 is not formed on the portion of the surfaces F1 where the gate electrode G is formed. Additionally, a material of the gate electrode G is metal, for example, Al.

The insulating film PV is, for example, an insulating layer such as SiO2 (silicon dioxide). The insulating film PV is formed in contact with the front surface F1 so as to cover a part of each electrode of the first electrode T1 and the gate electrode G. In other words, the insulating film PV is formed on the surface F1 so as to have an opening at the portions of the first electrode T1 and the gate electrode G. Here, the insulating film PV may be formed so as not to cover a part of each electrode of the first electrode T1 and the gate electrode G. Additionally, a configuration may be such that each electrode of the first electrode T1 and the gate electrode G covers a part of an insulating layer formed in contact with the front surface F1, while the insulating film PV covers a part of each electrode and the insulating layer formed in contact with the front surface F1.

Figure 2:
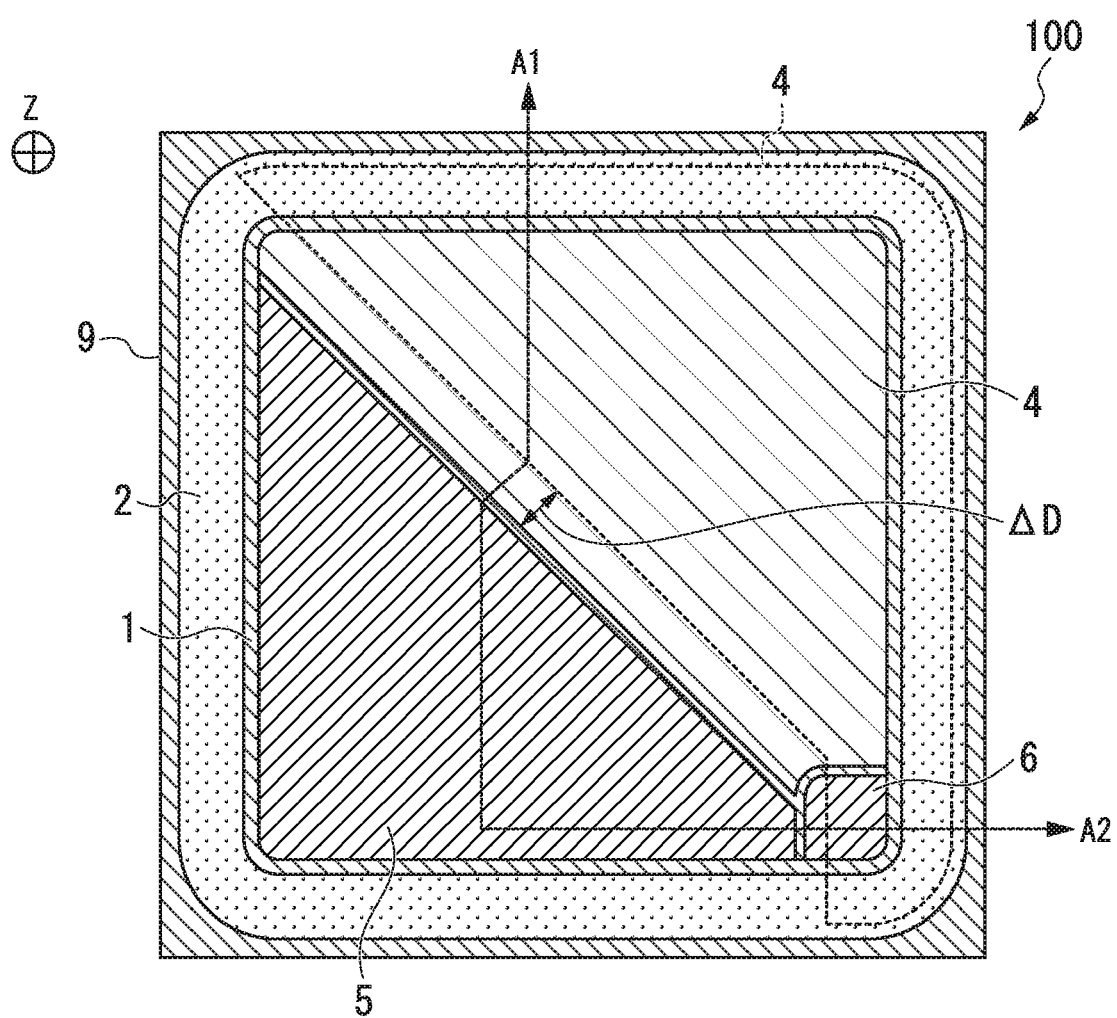
FIG. 2 is a plan view showing an example, viewed from a front-surface side, of the semiconductor device according to the present embodiment.

Additionally, FIG. 2 is a plan view, viewed from the front surface F1 side, showing an example of the semiconductor device 100 according to the present embodiment. Here, FIG. 2 shows the configuration of the semiconductor device 100 before the first electrode T1, the gate electrode G, and the insulating film PV are formed.

As shown in FIG. 2, on the front surface F1 side of the semiconductor device 100, the P+ region 1, the N− region 2, the N+ region 5, the N+ region 6, the P++ region 7, and the ISO portion 9 are formed to be exposed.

Additionally, on the rear surface F2 side of the semiconductor device 100, the N+ region 4 is formed to be exposed, as indicated by a broken line in FIG. 2. Here, the N+ region 4 and the N+ region 5 are formed apart by a predetermined distance ΔD in a direction parallel to the front surface F1 and the rear surface F2.

Next, a method for manufacturing the semiconductor device 100 is described with reference to FIGS. 3 to 8.

Figure 3:
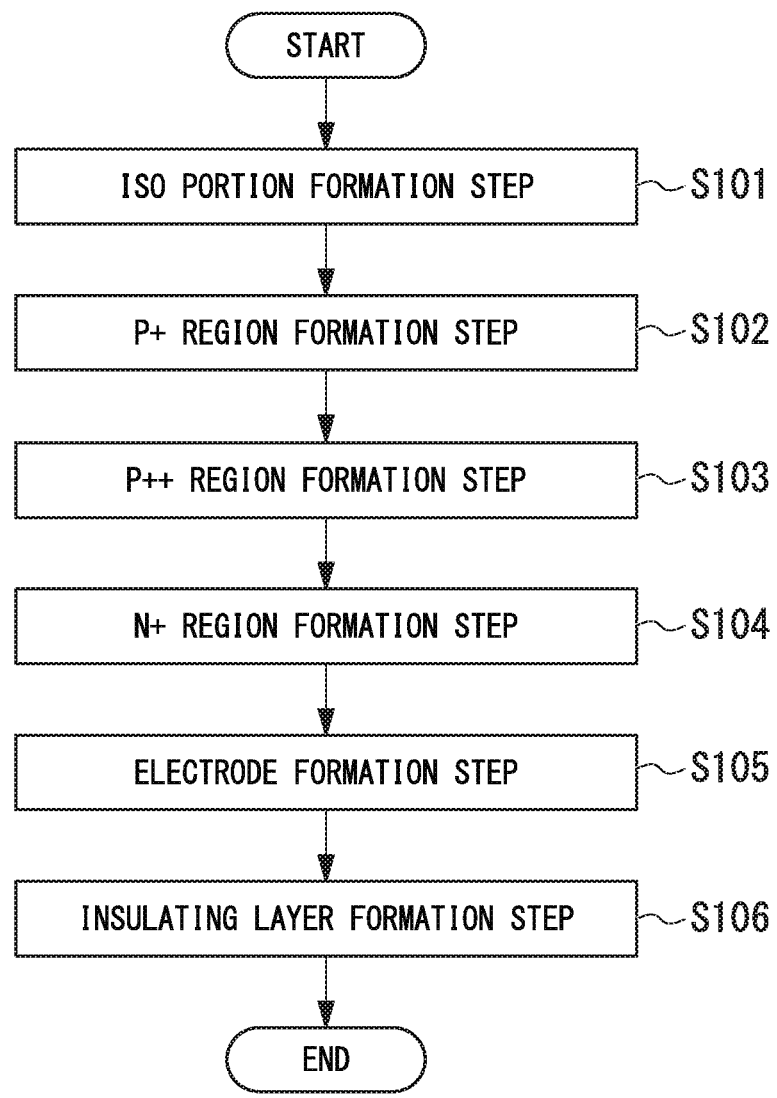
FIG. 3 is a process flow diagram showing an example of a method of manufacturing a semiconductor device according to the present embodiment.

FIG. 3 is a process flow diagram showing an example of the method of manufacturing the semiconductor device 100 of the present embodiment. Additionally, each of FIGS. 4 to 8 is a diagram showing an example of the manufacturing configuration of the semiconductor device 100 of the present embodiment.

Figure 4:
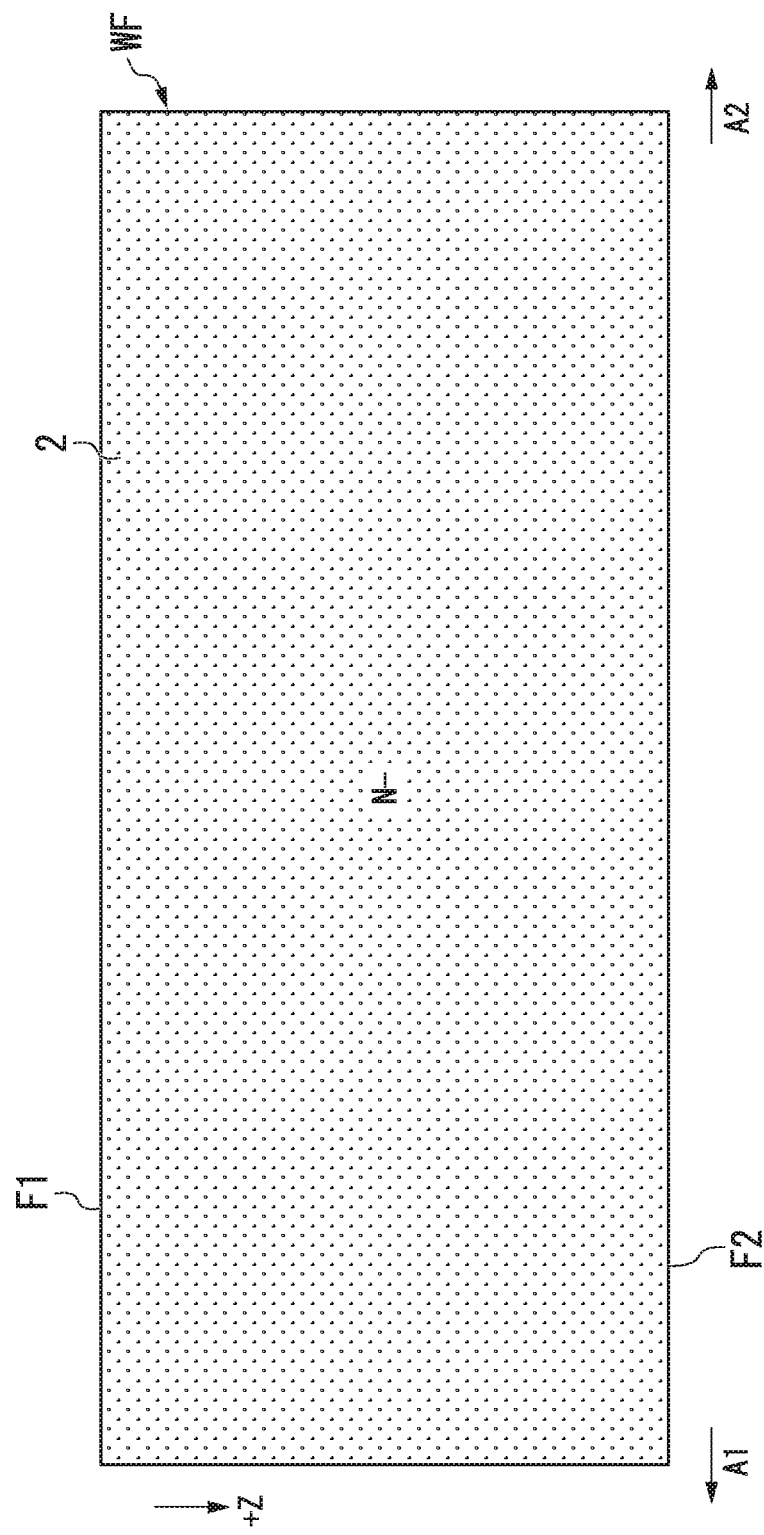
FIG. 4 is a first diagram showing an example of a step of manufacturing the semiconductor device according to the present embodiment.
Figure 5:
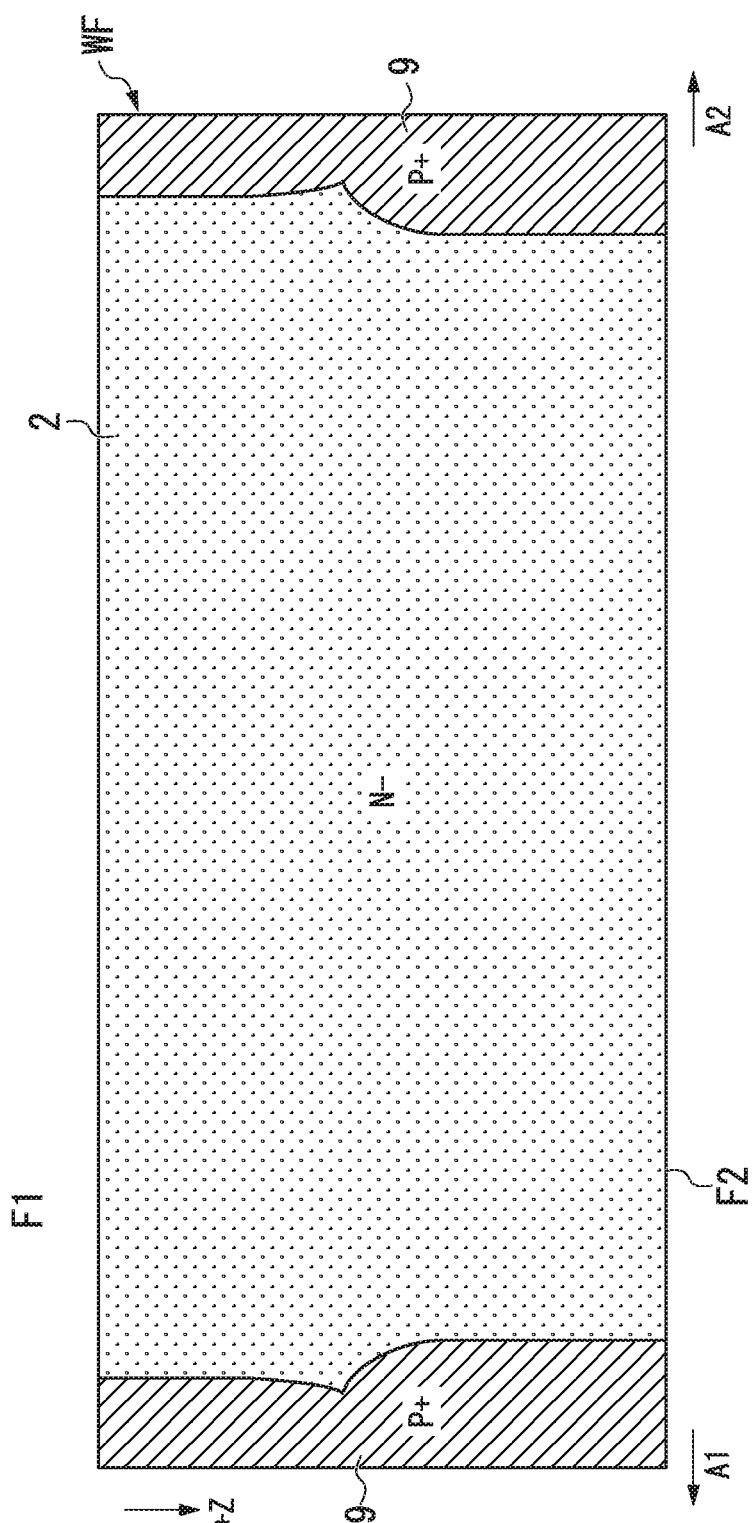
FIG. 5 is a second diagram showing an example of a step of manufacturing the semiconductor device according to the present embodiment.

As shown in FIG. 3, in the method of manufacturing the semiconductor device 100 of the present embodiment, first, a step of forming the ISO portion 9 is performed in an initial wafer (semiconductor substrate WF) (step S101). Here, the initial wafer (semiconductor substrate WF) is an N type semiconductor wafer, the whole of which is the N− region 2, as shown in FIG. 4. In this step of forming the ISO portion 9, a pattern is formed by a photolithography process (photolithography process) and an etching process, and a P type semiconductor impurity is thermally diffused simultaneously from both sides of the front surface F1 and the rear surface F2 into the semiconductor substrate WF. Thus, the ISO portion 9 (P+ region) is formed in the semiconductor substrate WF, as shown in FIG. 5.

Figure 6:
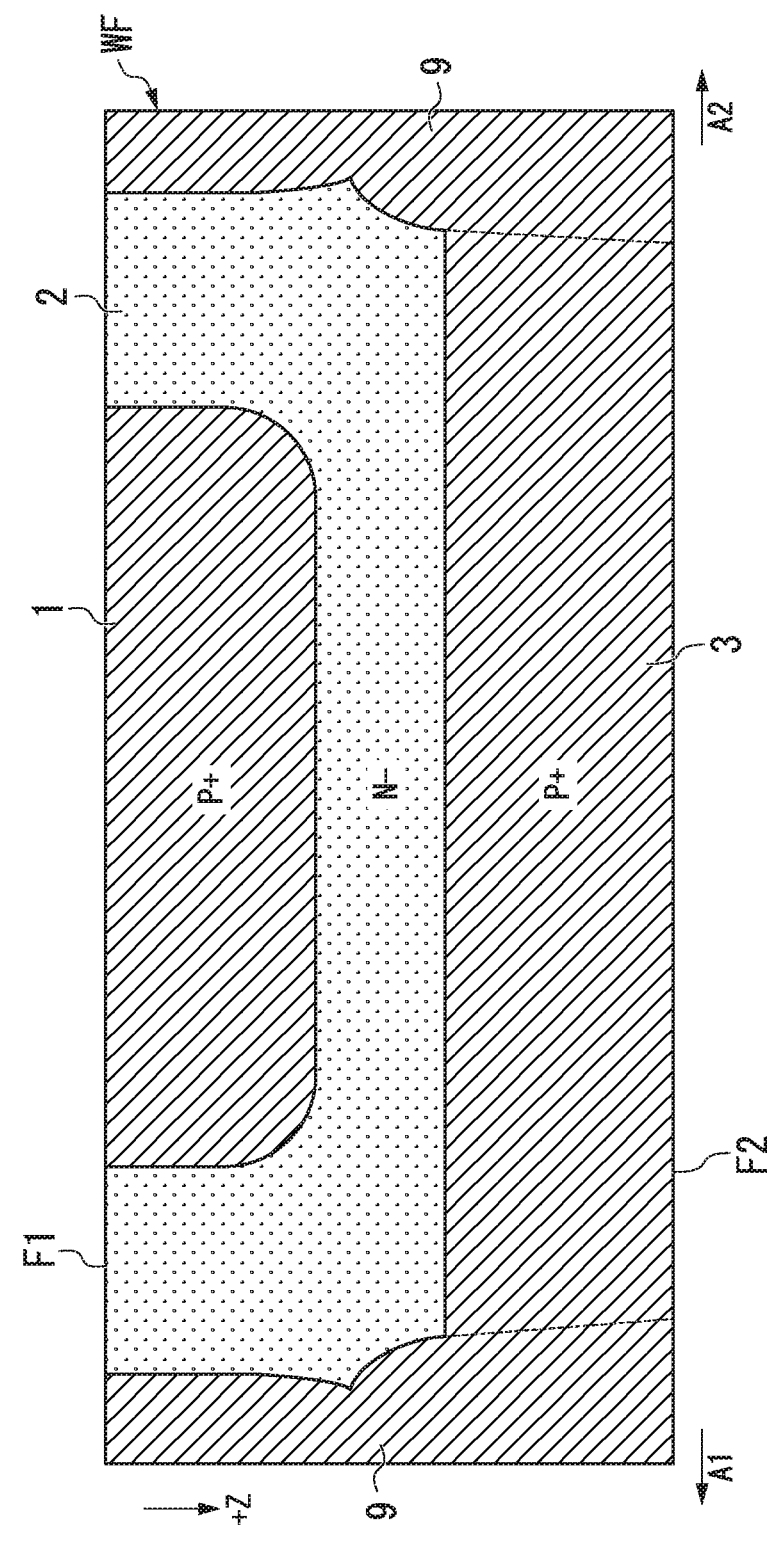
FIG. 6 is a third diagram showing an example of a step of manufacturing the semiconductor device according to the present embodiment.

Then, a step of forming the P+ regions (1, 3) is performed (step S102). In this step of forming the P+ regions (1, 3), a pattern is formed by a photolithography process and an etching process, and a P type semiconductor impurity is thermally diffused simultaneously from both sides of the front surface F1 and the rear surface F2 into the semiconductor substrate WF. Thus, the P+ region 1 and the P+ region 3 are formed in the semiconductor substrate WF, as shown in FIG. 6. Here, the P+ region 1 is formed so as to have a depth of, for example, 10 μm to 70 μm from the front surface F1 in the +Z axis direction. Additionally, the P+ region 3 is formed so as to have a depth of, for example, 10 μm to 70 μm from the rear surface F2 in the −Z axis direction.

Figure 7:
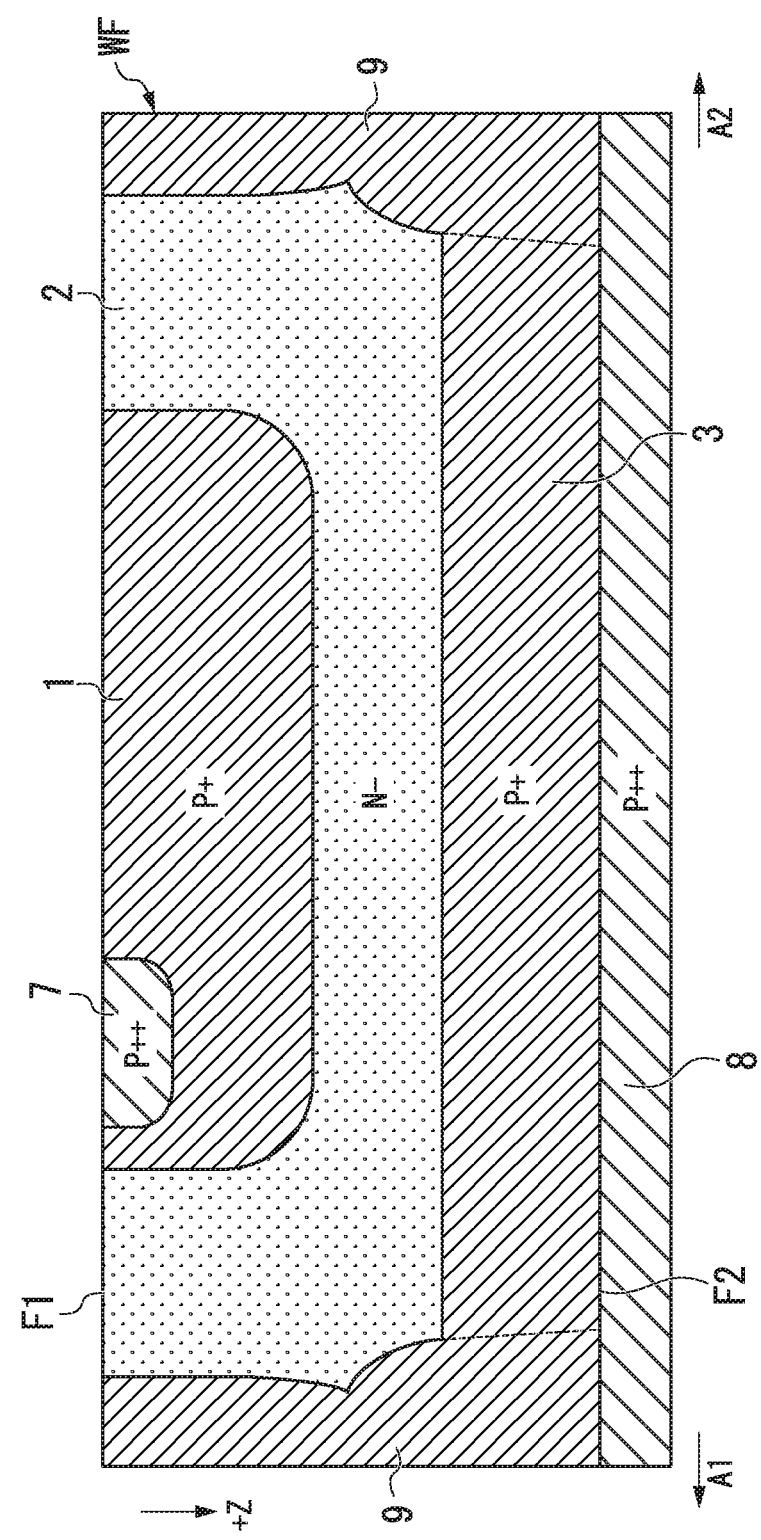
FIG. 7 is a fourth diagram showing an example of a step of manufacturing the semiconductor device according to the present embodiment.

Then, a step of forming the P++ regions (7, 8) is performed (step S103). In this step of forming the P++ regions (7, 8), a pattern is formed by a photolithography process and an etching process, and a P type semiconductor impurity is thermally diffused simultaneously from both sides of the front surface F1 and the rear surface F2 into the semiconductor substrate WF. Thus, the P++ region 7 and the P++ region 8 are formed in the semiconductor substrate WF, as shown in FIG. 7. Here, the P++ region 7 is formed on a part of the front surface F1 so as not to include a portion in contact with the gate electrode G. Additionally, the P++ region 8 is formed on the entire rear surface F2. Here, the P++ region 7 is formed so as to have a depth of, for example, 5 µm to 60 µm from the front surface F1 in the +Z axis direction. Further, the P++ region 8 is formed so as to have a depth of, for example, 5 µm to 60 µm from the rear surface F2 in the −Z axis direction.

Thus, the step of forming the P++ regions (7, 8) includes: a first step of forming the P++ region 7 of the P type semiconductor with a higher impurity concentration than that of the P+ region 1 so as to be in contact with the front surface F1 while being included in the P+ region 1 and apart from the N+ region 6; and a second step of forming the P++ region 8 of the P type semiconductor with a high impurity concentration than that of the P+ region 3 so as to be in contact with the rear surface F2, the N+ region 4, and the rear surface F2 side of the P+ region 3.

Figure 8:
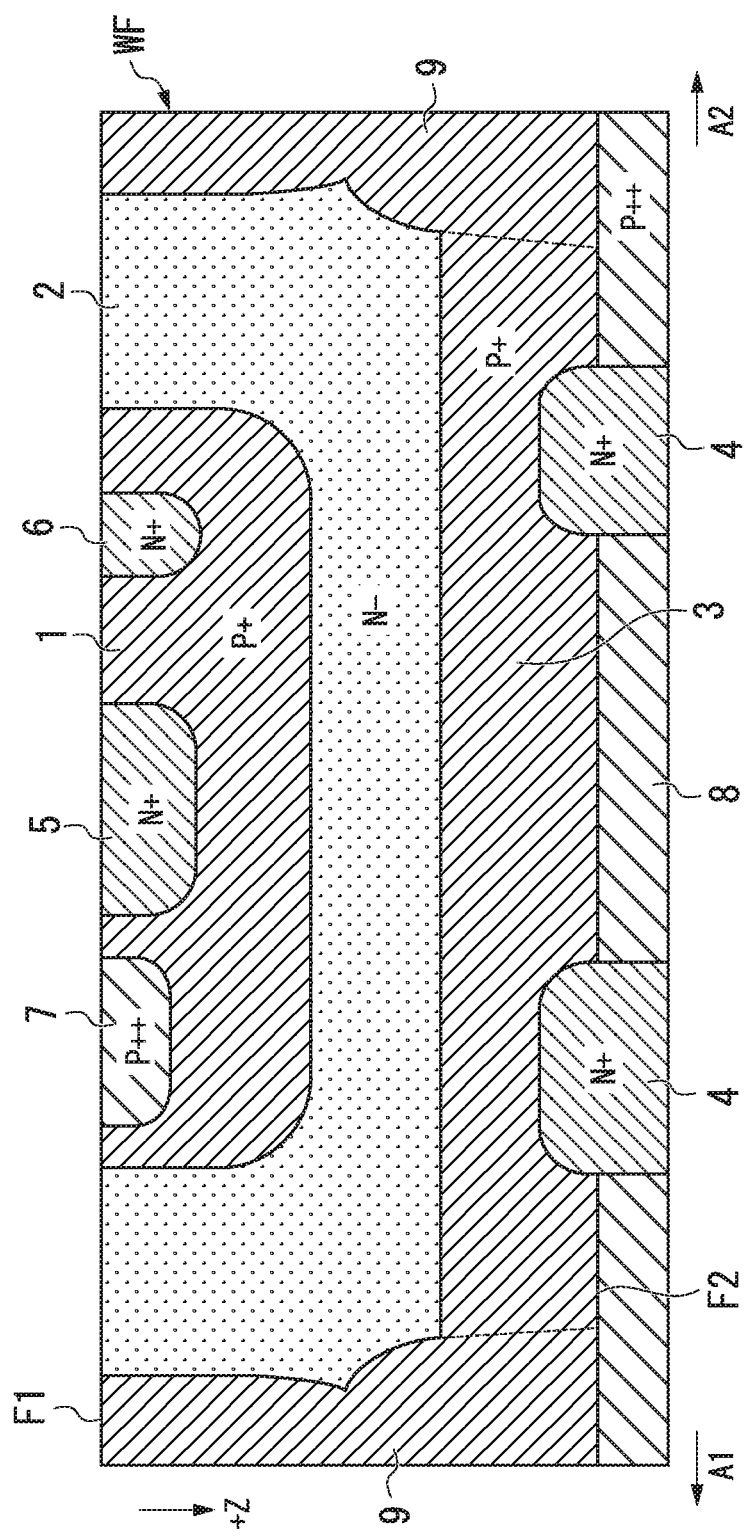
FIG. 8 is a fifth diagram showing an example of a step of manufacturing the semiconductor device according to the present embodiment.

Next, a step of forming the N+ regions (4, 5, 6) is performed (step S104). In this step of forming the N+ regions (4, 5, 6), a pattern is formed by a photolithography process and an etching process, and an N type semiconductor impurity is thermally diffused simultaneously from both sides of the front surface F1 and the rear surface F2 into the semiconductor substrate WF. Thus, the N+ region 5, the N+ region 6, and the N+ region 4 are formed in the semiconductor substrate WF, as shown in FIG. 8. Here, the N+ region 5 and the N+ region 6 are formed so as to have a depth of, for example, 5 µm to 60 µm from the front surface F1 in the +Z axis direction. Additionally, the N+ region 4 is formed so as to have a depth of, for example, 5 µm to 60 µm from the rear surface F2 in the −Z axis direction.

Next, a step of forming electrodes is performed (step S105). In this step of forming electrodes, a pattern is formed by a photolithography process and an etching process, and thereby the first electrode T1 and the gate electrode G are formed on the front surface F1 side. Additionally, the second electrode T2 is formed on the entire surface on the rear surface F2 side. Here, the first electrode T1 is formed in ohmic contact with each of the P+ region 1, the P++ region 7, and the N+ region 5. Additionally, the gate electrode G is formed in ohmic contact with each of the P+ region 1 and the N+ region 6. Further, the second electrode T2 is formed in ohmic contact with the P++ region 8 and the N+ region 4.

Next, a step of forming the insulating film PV is performed (step S106). In this step of forming the insulating film PV, a pattern is formed by a photolithography process and an etching process, and the insulating film PV is formed on the surface F 1 so as to have an opening at the portions of the first electrode T1 and the gate electrode G. Thus, the semiconductor device 100 having the above-described structure as shown in FIG. 1 is manufactured. Here, the step of forming the electrode (step S105) and the step of forming the insulating film PV (step S 106) may be reverse in order.

Next, operation of the semiconductor device 100 according to the present embodiment is described with reference to FIGS. 9 to 14.

Figure 9:
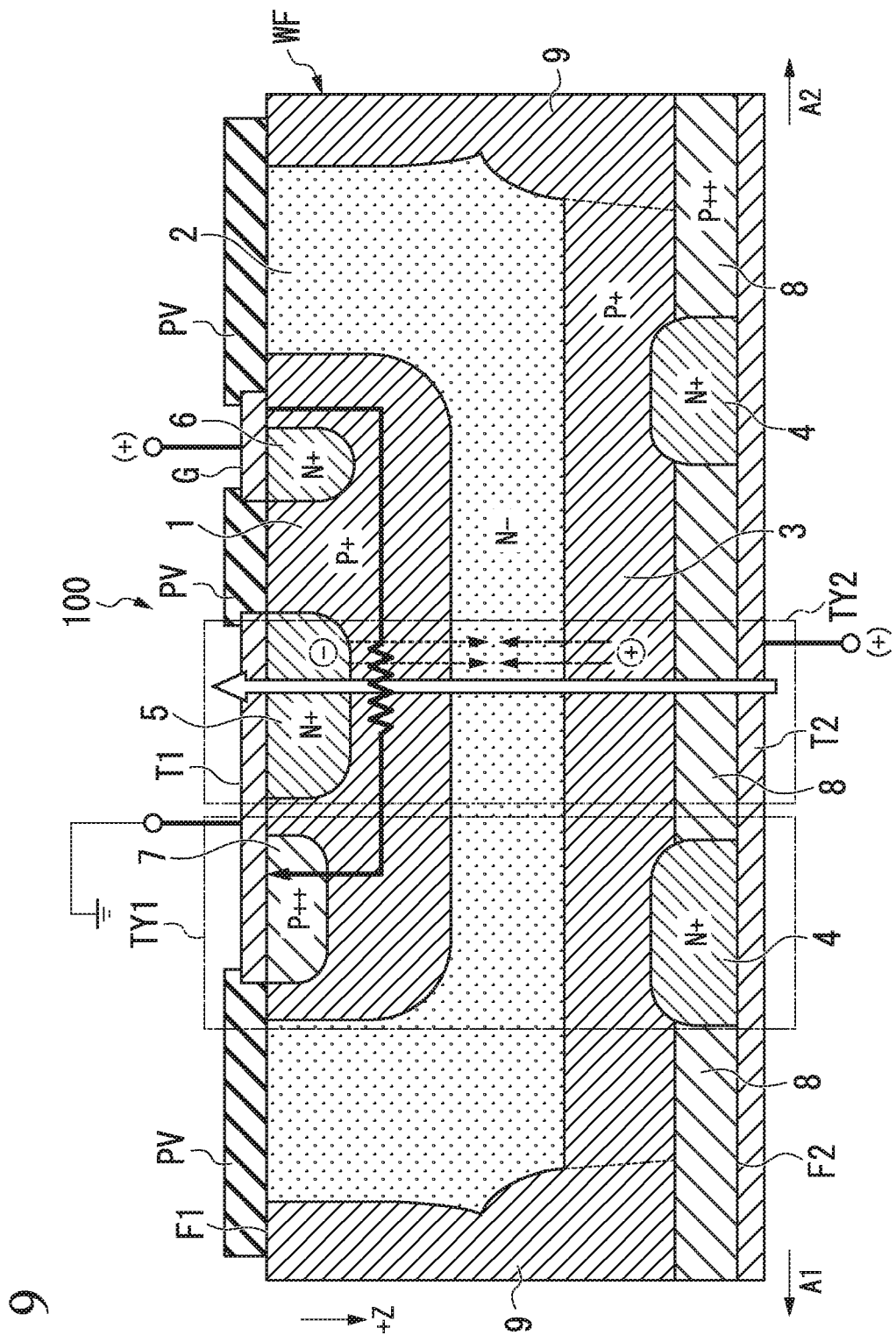
FIG. 9 is a diagram illustrating operation, in a mode-I, of the semiconductor device according to the present embodiment.
Figure 10:
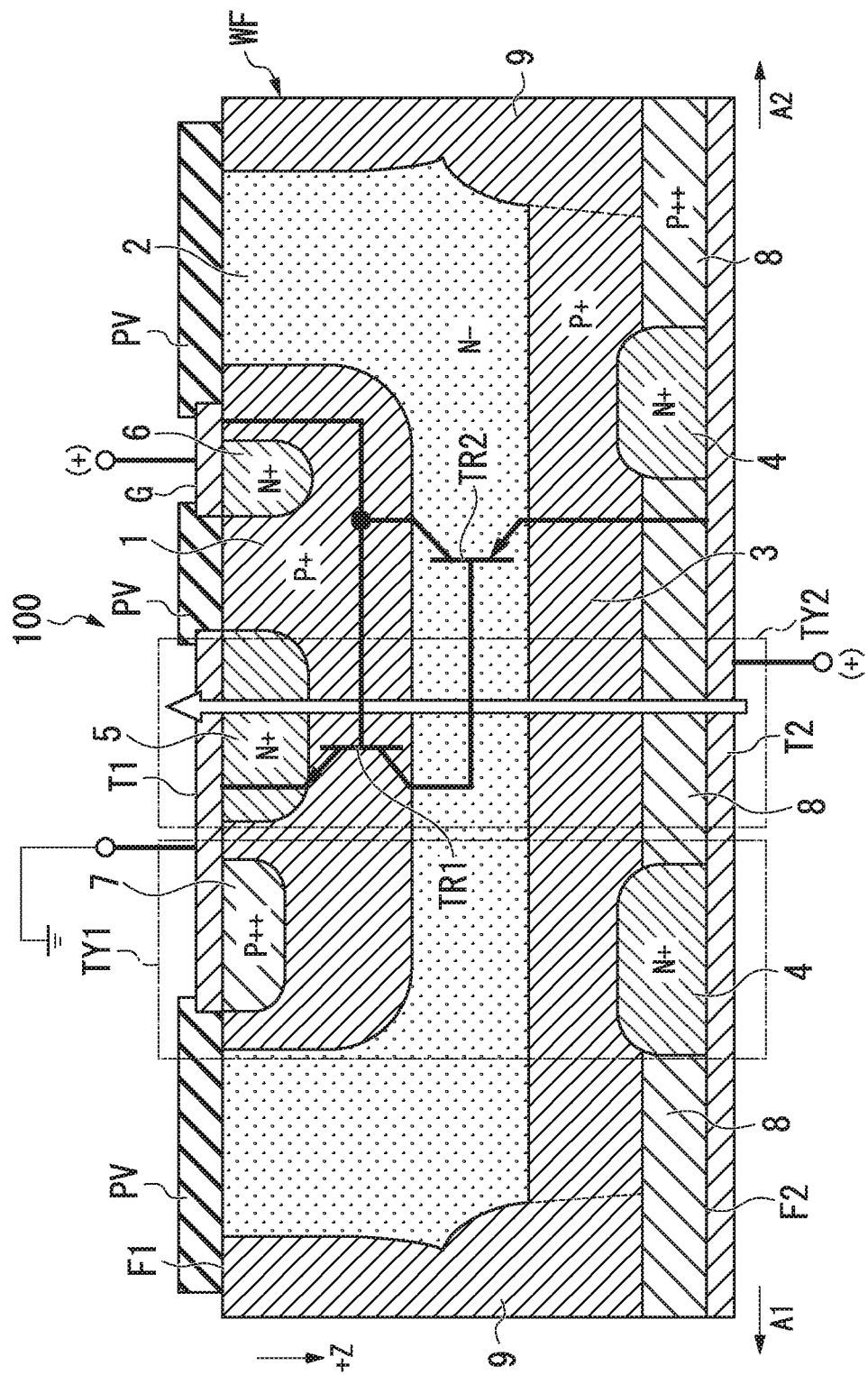
FIG. 10 is a diagram showing an equivalent circuit, in the mode-I, of the semiconductor device according to the present embodiment.

FIG. 9 is a diagram illustrating operation in the mode-I of the semiconductor device 100 according to the present embodiment. Additionally, FIG. 10 is a diagram showing an equivalent circuit in the mode-I of the semiconductor device 100 of the present embodiment. Here, the description of the equivalent circuit shown in FIG. 10 is superimposed on the sectional structure of the semiconductor device 100.

As shown in FIG. 9, in the mode-I of gate trigger current, the first electrode is connected to the ground, (+) voltage is applied to the second electrode T2, and a (+) voltage is applied to the gate electrode G. Here, the (+) voltage is a voltage higher than that of the ground (first electrode T1).

By the (+) voltage being applied to the gate electrode G, a gate trigger current flows from the gate electrode G to the first electrode T1. Thereby, in the P+ region 1, a voltage drop is generated due to the resistance in a lateral direction (direction parallel to the front surface F1), a junction between the P+ region 1 and the N+ region 5 becomes forward biased. As a result, electrons are injected from the N+ region 5 into the P+ region 1. Here, in FIG. 9, dashed arrows indicate the movement of the electrons.

Then, a part of the electrons injected into the P+ region 1 enters the N− region 2, so that electrons are accumulated in the N− region 2. As a result, the N− region 2 becomes lower in potential than the P+ region 3, and a junction between the P+ region 3 and the N− region 2 becomes forward biased, so that holes are injected into the N− region 2. Here, in FIG. 9, dashed-dotted arrows indicate the movement of the holes.

Then, a part of the holes injected into the N− region 2 enters the P+ region 1, so that the injection of the electrons from the N+ region 5 into the P+ region 1 is promoted.

The above action is repeated to amplify the injection of the electrons and the holes into the N− region 2, thus finally making a thyristor TY2 including the P+ region 3, the N− region 2, the P+ region 1, and the N+ region 5 turned on (conduction state). Here, in the semiconductor device 100 according to the present embodiment, since the P++ region 8 has the impurity concentration higher than that of the P+ region 3, thus enabling an improvement of the ohmic property of the second electrode T2. For this reason, the on-voltage of the thyristor TY2 can be reduced.

Additionally, as shown in FIG. 10, the equivalent circuit of the semiconductor device 100 in the mode-I of the gate trigger current includes: an NPN transistor (transistor TR1) including the N− region 2, the P+ region 1, and the N+ region 5; and a PNP transistor (transistor TR2) including the P+ region 3, the N− region 2, and the P+ region 1. Further, a base terminal of the transistor TR1 and a collector terminal of the transistor TR2 are connected to a gate electrode G, while a base terminal of the transistor TR2 and a collector terminal of the transistor TR1 are connected. Moreover, an emitter terminal of the transistor TR1 is connected to the first electrode T1, while an emitter terminal of the transistor TR2 is connected to the second electrode T2.

According to the equivalent circuit shown in FIG. 10, when a (+) voltage is applied to the gate electrode G, the gate trigger current flows from the gate electrode G to the first electrode T1. In other words, the base current of the transistor TR1 flows, and thus the collector current of the transistor TR1 begins to flow. Thereby, the base current of the transistor TR2 flows, and thus the collector current of the transistor TR2 begins to flow. Since the collector current of the transistor TR2 becomes the base current of the transistor TR1, two transistors mutually amplify each other and eventually are turned on (conductive state). Thereby, a state between the first electrode T1 and the second electrode T2 becomes the conductive state, and thus a current flows from the second electrode T2 to the first electrode T1.

Figure 11:
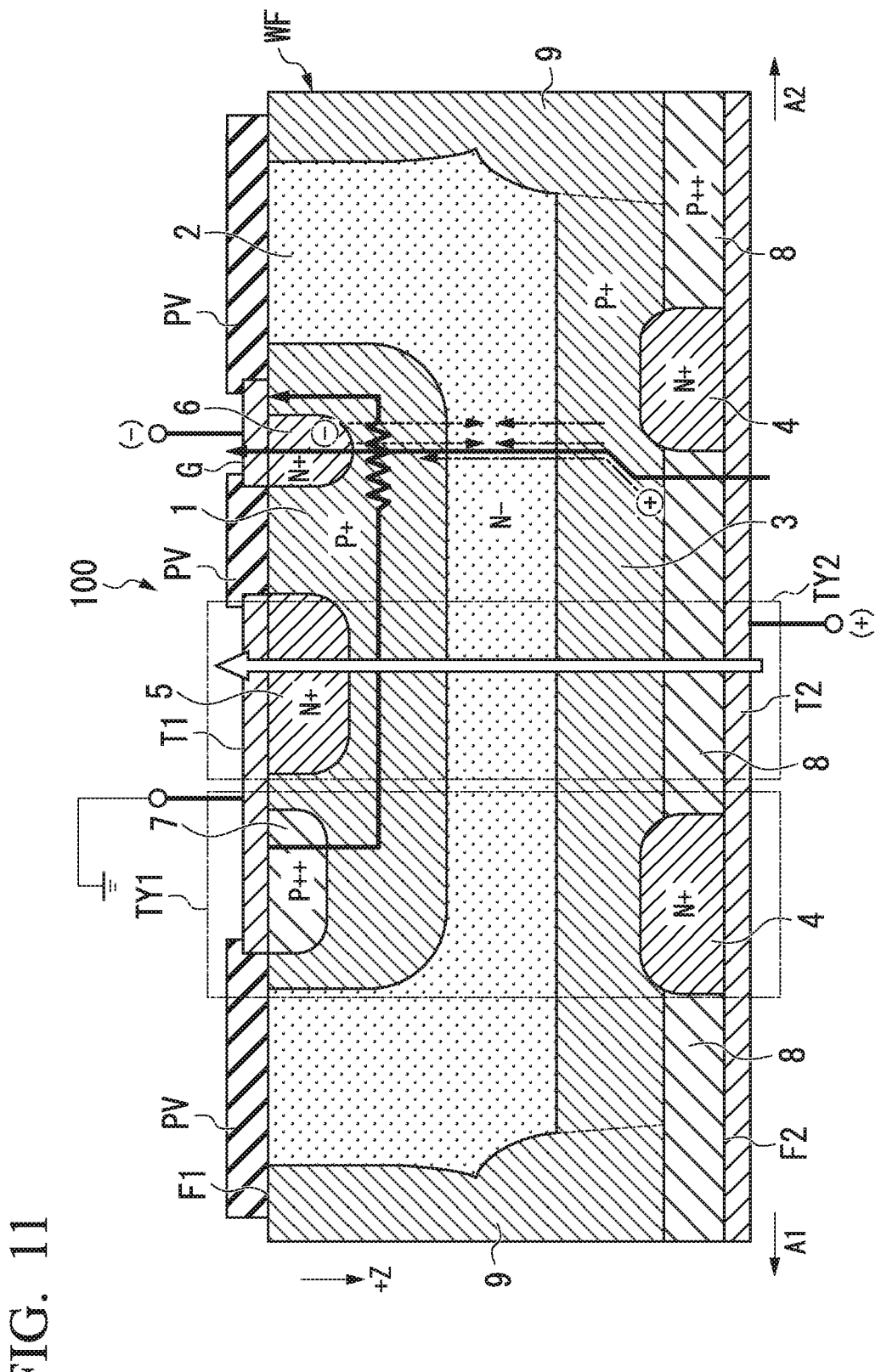
FIG. 11 is a diagram illustrating operation, in a mode-II, of the semiconductor device according to the present embodiment.
Figure 12:
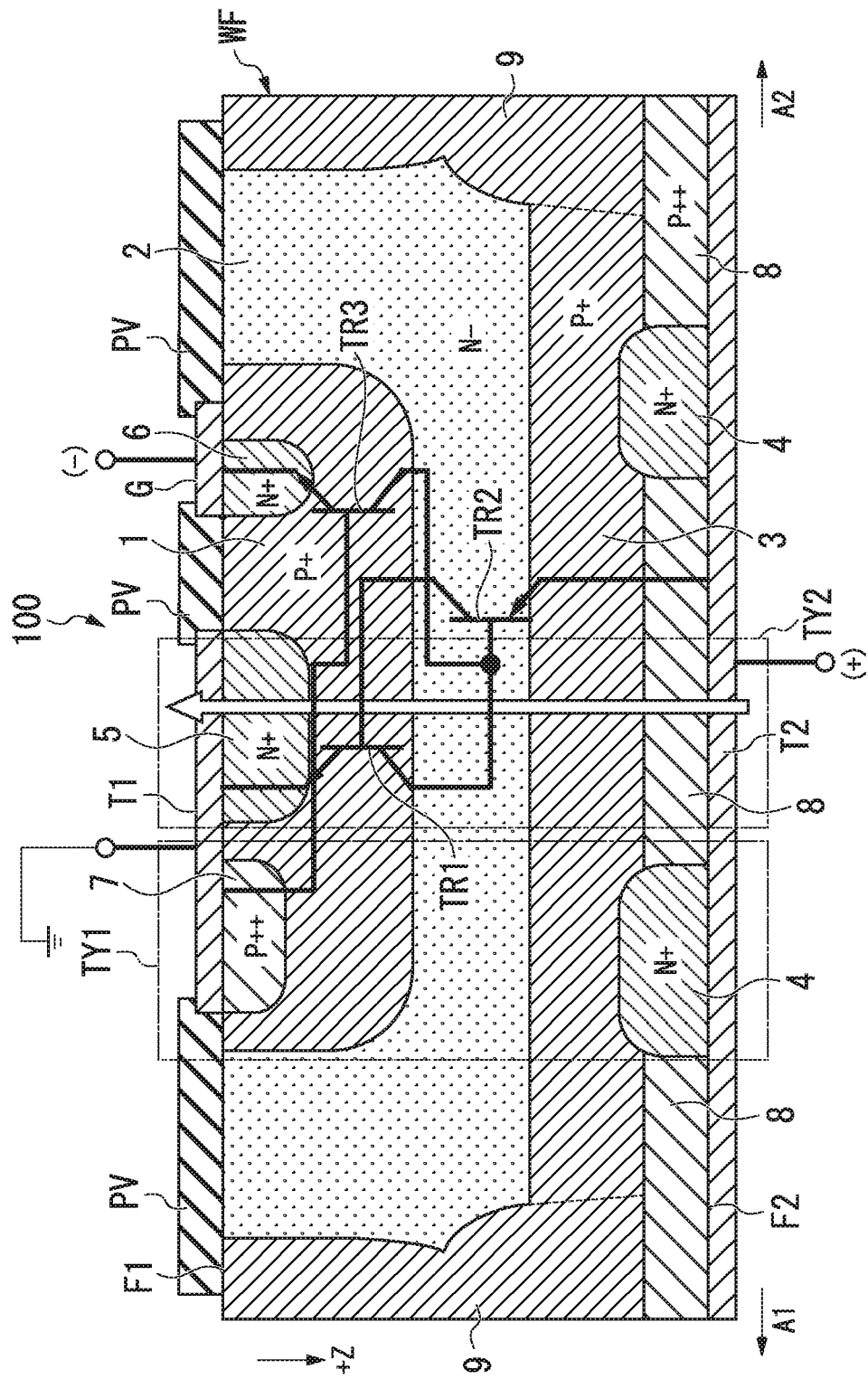
FIG. 12 is a diagram showing an equivalent circuit, in the mode-II, of the semiconductor device according to the present embodiment.

Next, FIG. 11 is a diagram illustrating operation in the mode-II of the semiconductor device 100 according to the present embodiment. Additionally, FIG. 12 is a diagram showing an equivalent circuit in the mode-II of the semiconductor device 100 of the present embodiment. Here, the description of the equivalent circuit shown in FIG. 12 is superimposed on the sectional structure of the semiconductor device 100.

As shown in FIG. 11, in the mode-II of the gate trigger current, the first electrode is connected to the ground, a voltage (+) is applied to the second electrode T2, and a voltage (−) is applied to the gate electrode G. Here, the voltage (−) is a voltage lower than that of the ground (first electrode T1) (e.g., negative voltage).

By the voltage (−) being applied to the gate electrode G, a gate trigger current flows from the first electrode T1 to the gate electrode G. Thereby, in the P+ region 1, a voltage drop is generated due to the resistance in a lateral direction (direction parallel to the front surface F1), a junction between the P+ region 1 and the N+ region 6 becomes forward biased. As a result, electrons are injected from the N+ region 6 into the P+ region 1. Here, in FIG. 11, dashed arrows indicate the movement of the electrons.

Then, a part of the electrons injected into the P+ region 1 enters the N− region 2, so that electrons are accumulated in the N− region 2. As a result, the N− region 2 becomes lower in potential than the P+ region 3, and the junction between the P+ region 3 and the N− region 2 becomes forward biased, so that holes are injected into the N− region 2. Here, in FIG. 11, dashed-dotted arrows indicate the movement of the holes.

Then, a part of the holes injected into the N− region 2 enters the P+ region 1, so that the injection of the electrons from the N+ region 6 to the P+ region 1 is promoted.

The above action is repeated to amplify the injection of the electrons and the holes into the N− region 2, thus finally making a gate mechanism portion (auxiliary thyristor) including the P+ region 3, the N− region 2, the P+ region 1, and the N+ region 6 turned on (conductive state).

Then, since the thyristor TY2 (main thyristor) including the P+ region 3, the N− region 2, the P+ region 1, and the N+ region 5 is close to the gate mechanism portion (auxiliary thyristor), the injection operation of the electrons and the holes is spread to the thyristor TY2, so that the thyristor TY2 is turned on (conductive state). Here, in the semiconductor device 100 according to the present embodiment, since the P++ region 8 has the impurity concentration higher than that of the P+ region 3, thus enabling an improvement of the ohmic property of the second electrode T2. For this reason, the on-voltage of the thyristor TY2 can be reduced.

Additionally, as shown in FIG. 12, the equivalent circuit of the semiconductor device 100 in the mode-II of the gate trigger current includes: the NPN transistor (transistor TR1) including the N− region 2, the P+ region 1, and the N+ region 5; the PNP transistor (transistor TR2) including the P+ region 3, the N− region 2, and the P+ region 1; and an NPN transistor (transistor TR3) including the N− region 2, the P+ region 1, and the N+ region 6. Further, the base terminal of the transistor TR1 and the collector terminal of the transistor TR2 are connected, while the base terminal of the transistor TR2, the collector terminal of the transistor TR1, and the collector terminal of the transistor TR3 are connected. Moreover, the emitter terminal of the transistor TR1 is connected to the first electrode T1, the emitter terminal of the transistor TR2 is connected to the second electrode T2, a base terminal of the transistor TR3 is connected to the first electrode T1, and an emitter terminal of the transistor TR3 is connected to the gate electrode G.

According to the equivalent circuit shown in FIG. 12, when the voltage (−) is applied to the gate electrode G, the gate trigger current flows from the first electrode T1 to the gate electrode G. In other words, the base current of the transistor TR3 flows, and thus the collector current of the transistor TR3 begins to flow. Thereby, the base current of the transistor TR2 flows, and thus the collector current of the transistor TR2 begins to flow. Further, the base current of the transistor TR1 flows, so that the collector current of the transistor TR1 begins to flow. Since the collector current of the transistor TR1 becomes the base current of the transistor TR2, two transistors mutually amplify each other and eventually are turned on (conductive state). Thereby, a state between the first electrode T1 and the second electrode T2 becomes the conductive state, so that a current flows from the second electrode T2 to the first electrode T1.

Here, in the semiconductor device 100 according to the present embodiment, since the P++ region 7 is not present at the portion of the gate electrode G (e.g., a peripheral portion of the N+ region 6), hFE (DC current amplification factor of the collector current) of the transistor TR3 is not reduced. For this reason, the semiconductor device 100 according to the present embodiment can suppress an increase of the gate trigger current in the mode-II.

Figure 13:
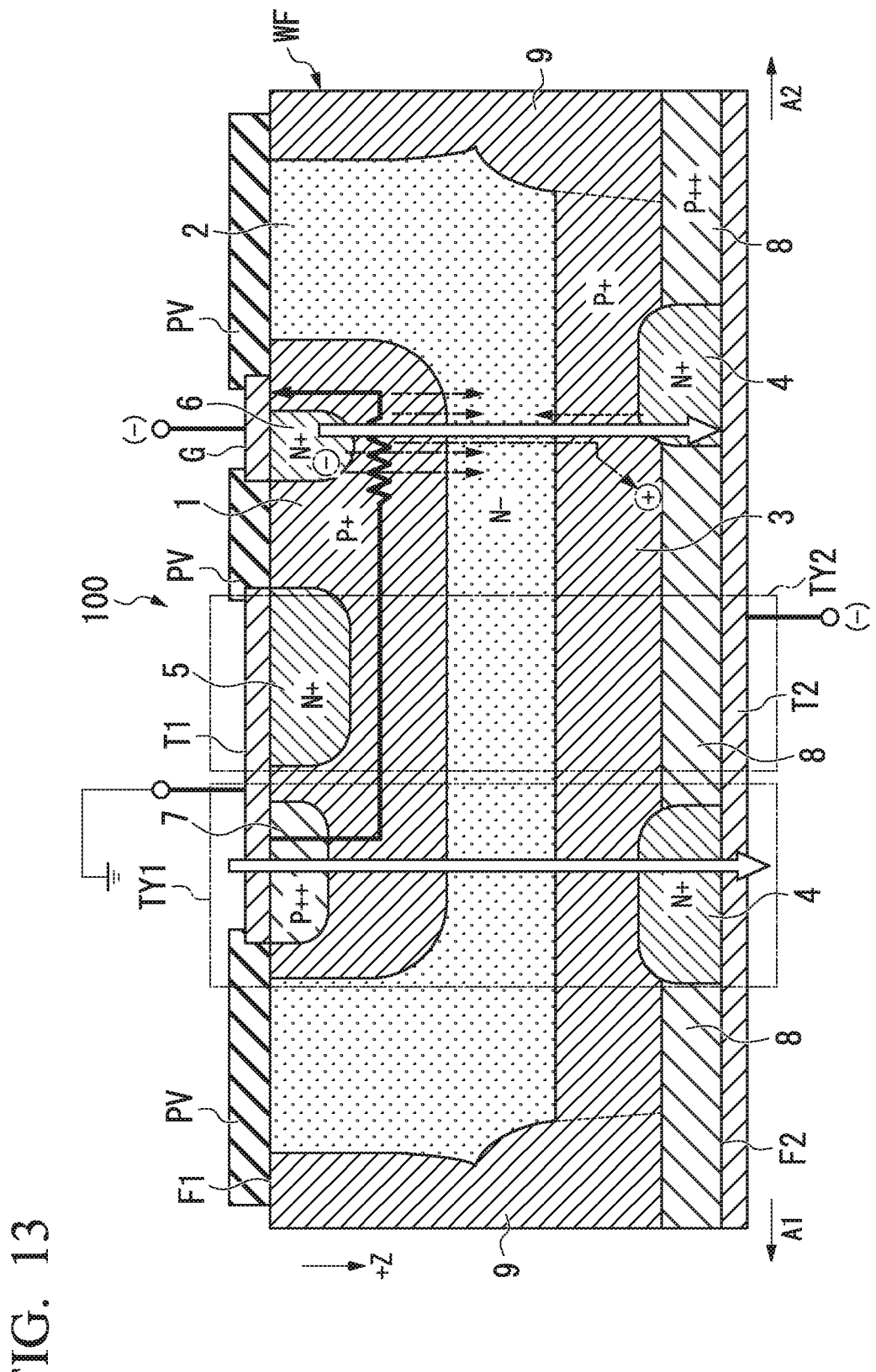
FIG. 13 is a diagram illustrating operation, in a mode-III, of the semiconductor device according to the present embodiment.
Figure 14:
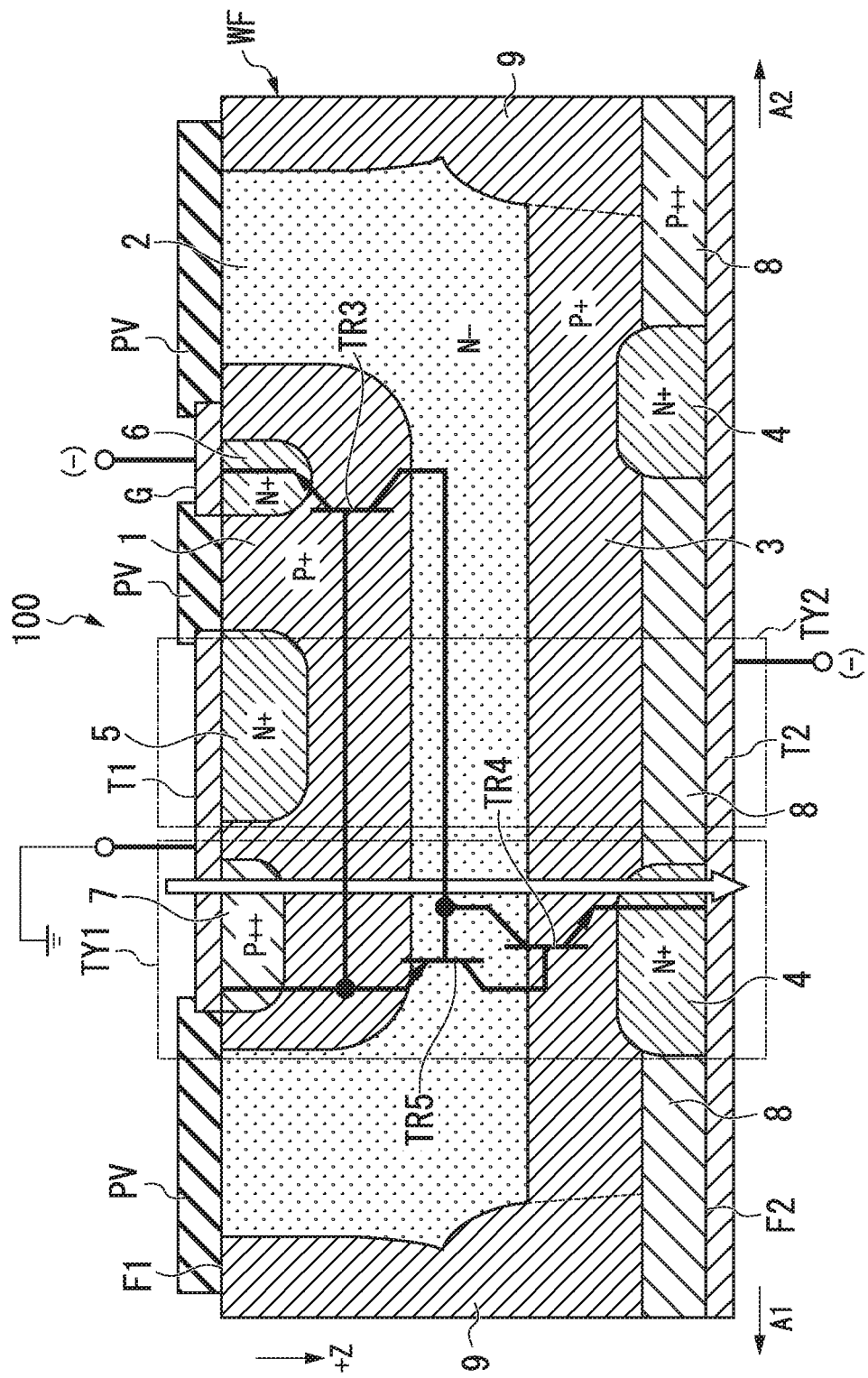
FIG. 14 is a diagram showing an equivalent circuit, in the mode-III, of the semiconductor device according to the present embodiment.

Next, FIG. 13 is a diagram illustrating operation in the mode-III of the semiconductor device 100 according to the present embodiment. Additionally, FIG. 14 is a diagram showing an equivalent circuit in the mode-III of the semiconductor device 100 of the present embodiment. Here, the description of the equivalent circuit shown in FIG. 14 is superimposed on the sectional structure of the semiconductor device 100.

As shown in FIG. 13, in the mode-III of the gate trigger current, the first electrode is connected to the ground, a voltage (−) is applied to the second electrode T2, and a voltage (−) is applied to the gate electrode G. Here, the voltage (−) is a voltage lower than that of the ground (first electrode T1) (e.g., negative voltage).

By the voltage (−) being applied to the gate electrode G, a gate trigger current flows from the first electrode T1 to the gate electrode G. Thereby, in the P+ region 1, a voltage drop is generated due to the resistance in a lateral direction (direction parallel to the front surface F1), a junction between the P+ region 1 and the N+ region 6 becomes forward biased. As a result, electrons are injected from the N+ region 6 into the P+ region 1. Here, in FIG. 13, dashed arrows indicate the movement of the electrons.

Then, a part of the electrons injected into the P+ region 1 enters the N− region 2, so that electrons are accumulated in the N− region 2. As a result, the N− region 2 becomes lower in potential than the P+ region 1, and the junction between the P+ region 1 and the N− region 2 becomes forward biased, so that holes are injected into the N− region 2. Here, in FIG. 13, dashed-dotted arrows indicate the movement of the holes.

Then, a part of the holes injected into the N− region 2 enters the second electrode T2 through the P+ region 3 and the P++ region 8. As a result, a voltage drop occurs in the P+ region 3, the junction between the N+ region 4 and the P+ region 3 becomes forward biased, so that electrons are injected from the N+ region 4 into the P+ region 3. Additionally, a part of the electrons injected into the P+ region 3 enters the N− region 2, so that five regions of the N+ region 6, the P+ region 1, the N− region 2, the P+ region 3, and the N+ region 4 enter a conductive state.

Then, since the thyristor TY1 (main thyristor) including the P+ region 1, the N− region 2, the P+ region 3, and the N+ region 4 is close to the above-described five conductive portions, injection operation of the electrons and the holes is spread to the thyristor TY1, so that the thyristor TY1 is turned on (conductive state). Here, in the semiconductor device 100 according to the present embodiment, the P++ region 7 has the impurity concentration higher than that of the P+ region 1, thereby enabling an improvement of the ohmic property of the second electrode T1. For this reason, the on-voltage of the thyristor TY1 can be reduced.

Additionally, as shown in FIG. 14, the equivalent circuit of the semiconductor device 100 in the mode-III of the gate trigger current includes: the NPN transistor (transistor TR3) including the N− region 2, the P+ region 1, and the N+ region 6; an NPN transistor (transistor TR4) including the N− region 2, the P+ region 3, and the N+ region 4; a PNP transistor (transistor TR5) including the P+ region 1, the N− region 2, and the P+ region 3. Additionally, the base terminal of the transistor TR3, an emitter terminal of the transistor TR5, and first electrode T1 are connected, while a base terminal of the transistor TR5, the collector terminal of the transistor TR3, and a collector terminal of the transistor TR4 are connected. Further, a base terminal of the transistor TR4 is connected to a collector terminal of the transistor TR5. Moreover, the emitter terminal of the transistor TR3 is connected to the gate electrode G, while an emitter terminal of the transistor TR4 is connected to the second electrode T2.

According to the equivalent circuit shown in FIG. 14, when the voltage (−) is applied to the gate electrode G, the gate trigger current flows from the first electrode T1 to the gate electrode G. In other words, the base current of the transistor TR3 flows, so that the collector current of the transistor TR3 begins to flow. Thereby, the base current of the transistor TR5 flows, so that the collector current of the transistor TR5 begins to flow. Further, the base current of the transistor TR4 flows, so that the collector current of the transistor TR4 begins to flow. Since the collector current of the transistor TR4 becomes the base current of the transistor TR5, two transistors mutually amplify each other and eventually are turned on (conductive state). Thereby, a state between the first electrode T1 and the second electrode T2 enters the conductive state, so that a current flows from the first electrode T1 to the second electrode T2.

Here, in the semiconductor device 100 according to the present embodiment, since the P++ region 7 is not present at the portion of the gate electrode G (e.g., a peripheral portion of the N+ region 6), hFE of the transistor TR3 is not reduced. For this reason, the semiconductor device 100 according to the present embodiment can suppress an increase of the gate trigger current in the mode-III.

Next, characteristics of the gate trigger current of the semiconductor device 100 according to the present embodiment will be described with reference to FIG. 15.

Figure 15:
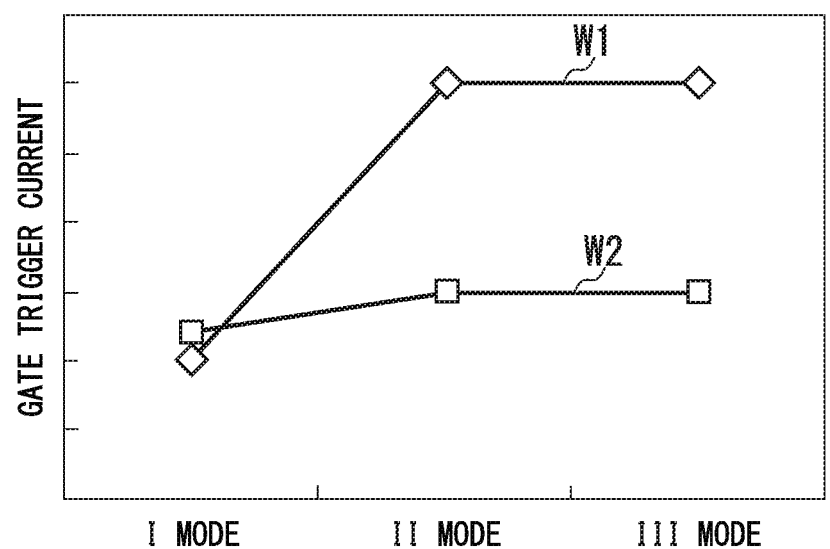
FIG. 15 it is a diagram showing characteristics of gate trigger currents of the semiconductor device according to the present embodiment.

FIG. 15 is a diagram showing the characteristics of the gate trigger current of the semiconductor device 100 according to the present embodiment.

In a graph shown in this figure, a vertical axis represents a gate trigger current, and a horizontal axis represents operation modes (mode-I, mode-II, and mode-III). Additionally, for comparison, a waveform W1 represents the characteristics of the gate trigger current in the conventional technique described in Patent Document 1. Further, a waveform W2 represents the characteristics of the gate trigger current of the semiconductor device 100 according to the present embodiment.

In the semiconductor device according to the prior art, since the P++ region 7 with the impurity concentration higher than that of the P+ region 1 is present at the portion of the gate electrode G (e.g., the peripheral portion of the N+ region 6), the above-described hFE of the transistor TR3 is reduced. For this reason, in the semiconductor device according to the prior art, as shown by the waveform W1 in FIG. 15, there occurs imbalance that the gate trigger current in the mode-II and the mode-III is higher than that in the mode-I.

In contrast, in the semiconductor device 100 according to the present embodiment, since the P++ region 7 with the impurity concentration higher than that of the P+ region 1 is not present at the portion of the gate electrode G (e.g., the peripheral portion of the N+ region 6), the above-described hFE of the transistor TR3 is not reduced. For this reason, in the semiconductor device 100 according to the present embodiment, as shown by the waveform W2 in FIG. 15, it is possible to suppress the gate trigger current in the mode-II and the mode-III from becoming higher than that in the mode-I.

As described above, the semiconductor device 100 according to the present embodiment includes the thyristor TY1 (first thyristor), the thyristor TY2 (second thyristor), the N+ region 6 (sixth region), the gate electrode G, the P++ region 7 (seventh region), and the P++ region 8 (eighth region). In the thyristor TY1, the P+ region 1 (first region) of the P type semiconductor (first conductivity type), the N− region 2 (second region) of the N type semiconductor (second conductivity type), the P+ region 3 (third region) of the P type semiconductor, the N+ region 4 (fourth region) of the N type semiconductor are joined sequentially from the front surface F1 side to the rear surface F2 of the semiconductor substrate WF having the front surface F1 (first surface) and the rear surface (second surface) F2 opposite to the front surface F1. In the thyristor TY1, a current flows from the first electrode T1 formed on the surface F1 while being electrically connected to the P+ region 1 to the second electrode T2 formed on the rear surface F2 while being electrically connected to the N+ region 4. Additionally, in the thyristor TY2, the P+ region 3, the N− region 2, the P+ region 1, and the N+ region 5 (fifth region) of the N type semiconductor formed in contact with the front surface F1 while being included in the P+ region 1 are joined sequentially from the rear surface F2 side to the front surface F1, and a current flows from the second electrode T2 to the first electrode T1 electrically connected to the N+ region 5. The N+ region 6 is a region of the N type semiconductor which is formed in contact with the front surface F1 while being included in the P+ region 1 and apart from the N+ region 5. The gate electrode G is an electrode formed on the front surface F1 while electrically connecting the P+ region 1 and the N+ region 6. The P++ region 7 is a region of the P type semiconductor with the impurity concentration higher than that of the P+ region 1, which is formed in contact with the front surface F1 while being included in the P+ region 1 and apart from the N+ region 6 and being electrically connected to the N+ region 5 by the first electrode T1. Then, the P++ region 8 is a region of the P type semiconductor with the impurity concentration higher than that of the P+ region 3, which is formed in contact with the rear surface F2 side of the P+ region 3 and the N+ region 4, and with the rear surface F2, while being electrically connected to the N+ region 4 by the second electrode T2.

Thus, in the semiconductor device 100 according to the present embodiment, the P++ region 7 with the impurity concentration higher than that of the P+ region 1 is formed in the P+ region 1 while being apart from the N+ region 6 electrically connected to the gate electrode G, and being electrically connected to the first electrode T1. Additionally, in the semiconductor device 100, the P++ region 8 with the impurity concentration higher than that of the P+ region 3 is formed in contact with the rear surface F2 side of the P+ region 3 and the N+ region 4, and with the rear surface F2, while being electrically connected to the N+ region 4 by the second electrode T2. The P++ region 7 has the impurity concentration higher than that of the P+ region 1, thus enabling an improvement of the ohmic property of the first electrode T1. The P++ region 8 has the impurity concentration higher than that of the P+ region 3, thus enabling an improvement of the ohmic property of the second electrode T2. For this reason, the semiconductor device 100 according to the present embodiment can reduce the on-voltages of the thyristor TY1 and the thyristor TY2.

Further, the P++ region 7 is formed apart from the N+ region 6 connected to the gate electrode G, thereby causing no reduction in hFE of the internal transistor (above-described transistor TR3). For this reason, the semiconductor device 100 according to the present embodiment can reduce the imbalance in gate trigger current among the trigger modes (the gate trigger currents of the mode-II and the mode-III can be reduced to about that of the mode-I). Therefore, the semiconductor device 100 according to the present embodiment can reduce the imbalance in gate trigger current among the trigger modes while reducing the on-voltage (see above-described FIG. 15).

Moreover, in the semiconductor device 100 according to the present embodiment, by the P++ region 7 and the P++ region 8 being formed, there is no change of the impurity concentration and the concentration gradient of the P+ region 1 and the N− region 2 which determine the breakdown voltage, and there is no change of the impurity concentration and the concentration gradient of the P+ region 3 and the N− region 2. For this reason, the semiconductor device 100 according to the present embodiment can secure predetermined breakdown voltages by the P+ region 1 and N− region 2, and the P+ region 3 and N− region 2. In other words, the semiconductor device 100 according to the present embodiment can reduce the on-voltage while securing the breakdown voltages of the thyristor TY1 and the thyristor TY2.

Additionally, in the present embodiment, the N+ region 4 and the N+ region 5 are formed apart by the predetermined distance ΔD in the direction parallel to the front surface F1 and the rear surface F2, so as not to overlap each other on the line perpendicular to the front surface F1 and the rear surface F2. Additionally, the predetermined distance ΔD is determined so that while the current is flowing in the thyristor TY1 in one direction or the thyristor TY2 in the opposite direction, residual carriers present in the current path of the thyristor through which the current is not flowing disappear.

Thus, by securing the predetermined distance D, the semiconductor device 100 according to the present embodiment can separate the current paths of the thyristor TY1 and the thyristor TY2 and make it hard for residual carriers to remain. In other words, the semiconductor device 100 according to the present embodiment, by securing the predetermined distance D, while the current is flowing in the thyristor TY1 in one direction or the thyristor TY2 in the opposite direction, can make residual carriers present in the current path of the thyristor through which the current is not flowing disappear, thereby enabling an improvement of the capability of (dv/dt)c. Therefore, the semiconductor device 100 according to the present embodiment can suppress a failure of commutation that the thyristor TY1 and the thyristor TY2 alternately enter the conductive state.

Here, the (dv/dt)c represents the largest rise rate of the off-voltage that does not cause reverse conduction in a case where from the state in which a specified on-current is flowing, the current is reduced at a specified current reduction rate, the current is reversed, and then a specified voltage is applied in a reverse direction to the previously-conducted direction, that is, for example, a smaller value of the values in both directions.

Further, in the present embodiment, the P++ region 7 is formed so as not to include the portion of the front surface F1, which is in contact with the gate electrode G.

Thus, since the P++ region 7 does not include the portion in contact with the gate electrode G, the semiconductor device 100 according to the present embodiment can suppress the reduction in above-described hFE of the transistor TR3.

Moreover, in the present embodiment, the P++ region 7 is the region formed by diffusing the P type semiconductor impurity from the front surface F1, and the P++ region 8 is the region formed by diffusing the P type semiconductor impurity from the rear surface F2. Then, the P++ region 7 and the P++ region 8 are the regions formed by simultaneously diffusing the P type semiconductor impurity.

Thereby, the semiconductor device 100 according to the present embodiment can shorten a formation time (formation period) of the P++ region 7 and the P++ region 8.

Additionally, a method of manufacturing a semiconductor device according to the present embodiment is a method of manufacturing the semiconductor device 100 including the above-described thyristor TY1, the thyristor TY2, the N+ region 6 of the N type semiconductor formed in contact with the front surface F1 while being included in the P+ region 1 and apart from the N+ region 5, and the gate electrode G formed on the surface F1 while being electrically connecting the P+ region 1 and the N+ region 6. The method includes a first step and a second step. Regarding the method of manufacturing the semiconductor device 100, in the first step, the P++ region 7 of the P type semiconductor with the impurity concentration higher than that of the P+ region 1 is formed so as to be in contact with the front surface F1 while being included in the P+ region 1 and apart from the N+ region 6 and being electrically connected to the N+ region 5 by the first electrode T1. Regarding the method of manufacturing the semiconductor device 100, in the second step, the P++ region 8 of the P type semiconductor with the impurity concentration higher than that of the P+ region 3 is formed so as to be in contact with the rear surface F2 side of the P+ region 3 and the N+ region 4, and with the rear surface F2, while being electrically connected to the N+ region 4 by the second electrode T2.

Thus, the method of manufacturing the semiconductor device 100 according to the present embodiment achieves the same effects as achieved by the above-described semiconductor device 100.

Here, the present invention is not limited to the above embodiment, and may be modified without departing from the scope of the present invention.

For example, in the manufacturing process shown in FIG. 3, although the example of diffusing an impurity simultaneously from both the front surface F1 and the rear surface F2 to form each region has been described, the diffusion may be performed per one surface. For example, the step of forming the P++ regions (7, 8) (step S103) may be divided into a first step of forming the P++ region and a second step of forming the P++ region 8, and performed separately. Further, in a case where the first step and the second step are performed separately, any one of the first step and the second step may be performed first.

In the above embodiment, although the example of simultaneously forming the N+ region 5 and the N+ region 6 has been described, the N+ region 5 and the N+ region 6 may be formed separately. Additionally, the N+ region 5 and the N+ region 6 may have different impurity concentrations, and may be regions with different depths in the Z axis direction.

Additionally, the description has been given in the above embodiment with respect to the example where the P++ region 7 is formed so as to be not in contact with the N+ region 5, the configuration is not limited thereto, and the P++ region 7 may be formed in contact with the N+ region 5. In other words, the P++ region 7 may be formed within the above-described predetermined distance ΔD.

Further, although the description has been given in the above-described embodiment under the assumption that the first conductivity type is the P type semiconductor, and the second conductivity type is the N type semiconductor, a configuration may be such that the first conductivity type is the N type semiconductor, and the second conductive type is the P type semiconductor.

DESCRIPTION OF REFERENCE NUMERALS 1, 3 P+ region
2 N− region
4, 5, 6 N+ region
7, 8 P++ region
9 ISO portion
100 semiconductor device
F1 front surface
F2 rear surface
G gate electrode
T1 first electrode
T2 second electrode
PV insulating film
TR1, TR2, TR3, TR4, TR5 transistor
TY1, TY2 thyristor
WF semiconductor substrate

The invention claimed is:

1. A semiconductor device, comprising:
a semiconductor substrate having a first surface and a second surface opposing the first surface;
a first electrode on the first surface;
a second electrode on the second surface; and
a gate electrode on the first surface, the gate electrode being not in direct physical contact with the first electrode,
wherein the semiconductor substrate includes:
a first region of a first conductivity type in contact with the first surface;
a second region of a second conductivity type in contact with the first surface, the second region including the first region;
a third region of the first conductivity type in contact with the second surface;
a fourth region of the first conductivity type between the second region and the third region, the fourth region being not in direct physical contact with the first surface and the second surface, the fourth region having an impurity concentration lower than that of the third region;
a fifth region of the second conductivity type included in the first region, the fifth region being in contact with the first surface and the first electrode;
a sixth region of the second conductivity type included in the first region, the sixth region being in contact with the first surface and the gate electrode, and the sixth region being not in direct physical contact with the fifth region and the first electrode;
a seventh region of the first conductivity type included in the first region, the seventh region having an impurity concentration higher than that of the first region, the seventh region being in contact with the first surface and the first electrode, and the seventh region being not in direct physical contact with the fifth region, the sixth region, and the gate electrode;
an eighth region of the second conductivity type in contact with the second surface, the third region, and the fourth region, and the eighth region being not in direct physical contact with the first region and the second region;
a first thyristor in which the seventh region, the first region, the second region, the fourth region, and the eighth region are joined sequentially from the first surface to the second surface, and the first thyristor being configured to allow a first current to flow from the first electrode to the second electrode;
a second thyristor in which the third region, the fourth region, the second region, the first region, and the fifth region are joined sequentially from the second surface to the first surface, and the second thyristor being configured to allow a second current to flow from the second electrode to the first.

2. The semiconductor device according to claim 1, wherein the fourth region and the fifth region are separated by a first distance in a direction parallel to the first surface and the second surface, so as not to overlap each other on a line perpendicular to the first surface and the second surface, and
the first distance is determined so that while one of the first thyristor and the second thyristor is turned on, no residual carriers are present in a current path of another one of the first thyristor and the second thyristor, which is turned off.

3. A method of manufacturing a semiconductor device, comprising:
forming a semiconductor substrate having a first surface and a second surface opposing the first surface;
forming a first electrode on the first surface;
forming a second electrode on the second surface;
forming a gate electrode on the first surface, the gate electrode being not in direct physical contact with the first electrode,
forming, in the semiconductor substrate, a first region of a first conductivity type in contact with the first surface;
forming, in the semiconductor substrate, a second region of a second conductivity type in contact with the first surface, the second region including the first region;
forming, in the semiconductor substrate, a third region of the first conductivity type in contact with the second surface;
forming, in the semiconductor substrate, a fourth region of the first conductivity type between the second region and the third region, the fourth region being not in direct physical contact with the first surface and the second surface, the fourth region having an impurity concentration lower than that of the third region;
forming, in the semiconductor substrate, a fifth region of the second conductivity type included in the first region, the fifth region being in contact with the first surface and the first electrode;
forming, in the semiconductor substrate, a sixth region of the second conductivity type included in the first region, the sixth region being in contact with the first surface and the gate electrode, and the sixth region being not in direct physical contact with the fifth region and the first electrode;

forming, in the semiconductor substrate, a seventh region of the first conductivity type included in the first region, the seventh region having an impurity concentration higher than that of the first region, the seventh region being in contact with the first surface and the first electrode, and the seventh region being not in direct physical contact with the fifth region, the sixth region, and the gate electrode;

forming, in the semiconductor substrate, an eighth region of the second conductivity type in contact with the second surface, the third region, and the fourth region, and the eighth region being not in direct physical contact with the first region and the second region.

4. The method according to claim 3, wherein forming the seventh region comprises diffusing a first semiconductor impurity of the first conductivity type from the first surface, and forming the eighth region comprises diffusing a second semiconductor impurity of the first conductivity type from the first surface.

5. The method according to claim 4, wherein forming the seventh region and forming the eighth region are simultaneously performed.

* * * * *